(12) United States Patent
Xia et al.

(10) Patent No.: US 8,742,657 B2
(45) Date of Patent: Jun. 3, 2014

(54) TRIPLET-TRIPLET ANNIHILATION UP CONVERSION (TTA-UC) FOR DISPLAY AND LIGHTING APPLICATIONS

(75) Inventors: Chuanjun Xia, Lawrenceville, NJ (US); Michael S Weaver, Princeton, NJ (US); Jason Brooks, Philadelphia, PA (US)

(73) Assignee: Universal Display Corporation, Ewing, NJ (US)

( * ) Notice: Subject to any disclaimer, the term of this patent is extended or adjusted under 35 U.S.C. 154(b) by 295 days.

(21) Appl. No.: 12/901,901

(22) Filed: Oct. 11, 2010

(65) Prior Publication Data

US 2011/0304263 A1 Dec. 15, 2011

Related U.S. Application Data

(60) Provisional application No. 61/397,542, filed on Jun. 11, 2010.

(51) Int. Cl.
*H01J 1/62* (2006.01)
*H01J 63/04* (2006.01)

(52) U.S. Cl.
USPC ............ 313/504; 313/501; 313/503; 313/506

(58) Field of Classification Search
USPC .................................................. 313/504, 501
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,541,012 A * | 7/1996 | Ohwaki et al. | 428/690 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,912,257 A * | 6/1999 | Prasad et al. | 514/356 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |

(Continued)

FOREIGN PATENT DOCUMENTS

EP 1725079 11/2006
EP 2034538 3/2009

(Continued)

OTHER PUBLICATIONS

International Search Report in PCT/US2011/040101 application.

(Continued)

*Primary Examiner* — Thomas A Hollweg
(74) *Attorney, Agent, or Firm* — Morris & Kamlay LLP

(57) ABSTRACT

Novel devices comprising a layer including compounds that are capable of triplet triplet annihilation up conversion (TTA-UC). In particular, the up-conversion layer absorbs light emitted by the OLED device and emits up-converted light with shorter wavelength in response. These devices may be used to provide improved lifetime for blue emitting devices.

32 Claims, 4 Drawing Sheets

(56) References Cited

U.S. PATENT DOCUMENTS

| | | | |
|---|---|---|---|
| 6,653,778 B1* | 11/2003 | Tomiuchi et al. | 313/501 |
| 6,687,266 B1 | 2/2004 | Ma et al. | |
| 6,699,406 B2* | 3/2004 | Riman et al. | 252/301.36 |
| 6,835,469 B2 | 12/2004 | Kwong et al. | |
| 6,844,387 B2* | 1/2005 | Bass et al. | 524/403 |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,471,706 B2 | 12/2008 | Bass et al. | |
| 7,534,505 B2 | 5/2009 | Lin et al. | |
| 7,969,646 B2* | 6/2011 | Miteva et al. | 359/326 |
| 8,270,068 B1* | 9/2012 | Bass et al. | 359/328 |
| 8,399,900 B2* | 3/2013 | Hartmann | 257/98 |
| 2002/0034656 A1 | 3/2002 | Thompson et al. | |
| 2002/0074935 A1* | 6/2002 | Kwong et al. | 313/504 |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0140758 A1* | 7/2004 | Raychaudhuri et al. | 313/504 |
| 2004/0174116 A1 | 9/2004 | Lu et al. | |
| 2005/0025993 A1 | 2/2005 | Thompson et al. | |
| 2005/0056815 A1* | 3/2005 | Miteva et al. | 252/582 |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2007/0285000 A1* | 12/2007 | Lim et al. | 313/501 |
| 2007/0297750 A1 | 12/2007 | Bass et al. | |
| 2008/0015355 A1 | 1/2008 | Schafer et al. | |
| 2008/0018221 A1 | 1/2008 | Egen et al. | |
| 2008/0103279 A1 | 5/2008 | Heun et al. | |
| 2008/0106190 A1 | 5/2008 | Yabunouchi et al. | |
| 2008/0124572 A1 | 5/2008 | Mizuki et al. | |
| 2008/0128728 A1* | 6/2008 | Nemchuk et al. | 257/98 |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2009/0224659 A1* | 9/2009 | Miteva et al. | 313/504 |
| 2009/0251765 A1* | 10/2009 | Miteva et al. | 359/326 |
| 2011/0089458 A1* | 4/2011 | Hartmann | 257/98 |
| 2012/0176301 A1* | 7/2012 | Gibson et al. | 345/88 |

FOREIGN PATENT DOCUMENTS

| | | |
|---|---|---|
| JP | 200511610 | 1/2005 |
| JP | 2007123392 | 5/2007 |
| JP | 2007254297 | 10/2007 |
| JP | 2008074939 | 10/2009 |
| WO | 0650955 | 5/1995 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008056746 | 5/2008 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2006072002 | 7/2009 |
| WO | WO 2009086028 | 7/2009 |
| WO | WO 2009100991 | 8/2009 |
| WO | WO 2010/028262 | 3/2010 |

OTHER PUBLICATIONS

Miteva, T., Yakutkin, V., Nelles, G., Baluschev, S.: "Annihilation assisted upconversion: all-organic, flexible and transparent multicolour display", New Journal of Physics, vol. 10, Oct. 2, 2008.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

U.S. Appl. No. 61/397,542, filed Jun. 11, 2010.

Islangulov et al., "Low power upconversion using MLCT sensitizers", Chem. Comm. 2005, 3776-3777.

Singh-Rachford et al., "Low Power Visible-to-UV Upconversion" J. Phys. Chem. A 2009, 113, 5912-5917.

Singh-Rachford et al., "Supra-Nanosecond Dynamics of a Red-to-Blue Photon Upconversion System" Inorg. Chem. 2009, 48, 2541-2548.

Islangulov et al., "Noncoherent Low-Power Upconversion in Solid Polymer Films" J. Am. Chem. Soc. 2007, 129, 12652-12653.

Singh-Rachford et al., "Pd(II) Phthalocyanine-Sensitized Triplet-Triplet Annihilation from Rubrene", J. Phys.Chem. A 2008, 112, 3550-3556.

(56) References Cited

OTHER PUBLICATIONS

Singh-Rachford et al., "Photochemical Upconversion Approach to Broad-Band Visible Light Generation" J. Phys. Chem. A 2008, 112, 3906-3910.
Zhao et al., "Upconverted Emission from Pyrene and Di-tert-butylpyrene Using Ir(ppy)3 as Triplet Sensitizer", J. Phys. Chem. A 2006, 110, 11440-11445.
Singh-Rachford et al., "Boron Dipyrromethene Chromophores: Next Generation Triplet Acceptors/Annihilators for Low Power Upconversion Schemes", J. Am. Chem. Soc. 2008, 130, 16164-16165.
Baluschev et al., "Blue-Green Up-Conversion: Noncoherent Excitation by NIR Light" Angew. Chem. Int. Ed. 2007, 46, 7693-7696.
Chen et al., "White-light emission from an upconverted emission with an organic triplet sensitizer" Chem. Commun. 2009, 4064-4066.
Laquai et al., "Efficient upconversion fluorescence in a blue-emitting spirobifluorene-anthracene copolymer doped with low concentrations of Pt(II)octaethylporphyrin", The Journal of Chemical Physics 2005, 123, 074902.
Merkel et al., "Low-power green-to-blue and blue-to-UV upconversion in rigid polymer films" Journal of Luminescence 2009, 129, 303-306.
Cheng et al., "Kinetic analysis of photochemical upconversion by triplet-triplet annihilation: beyonf any spin statistical limit", J. Phys. Chem. Lett. 2010, 1, 1795-1799.
Singh-Rachford et al., "Triplet Sensitized Red-to-Blue Photon Upconversion", J. Phys. Chem. Lett. 2010, 1, 195-200.
D.Y. Kondakov, et al., Triplet annihilation exceeding spin statistical limit in highly efficient fluorescent organic light-emitting diodes, J. Appl. Phys. 106, 124510 (2009).
Rapaport et al., "Review of the properties of up-conversion phosphors for new emissive displays", Journal of Display Technology, 2, 68 (2006).
Singh-Rachford et al., "Influence of Temperature on Low-Power Upconversion in Rubbery Polymer Blends", J. Am. Chem. Soc. 2009, 131, 12007-12014.
Cheng et al., "On the efficiency limit of triplet-triplet annihilation for photochemical upconversion", Phys. Chem. Chem. Phys., 2010, 12, 66-71.
Monguzzi et al., "Upconversion-induced delayed fluorescence in multicomponent organic systems: Role of Dexter energy transfer", Physical Review, 2008, 77, 155122.
Kuwabara, Yoshryuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Tung, Yung-Liang et al., "Organic Light-Emitting Diodes Based on Charge-Neutral $Ru^{II}$ PHosphorescent Emitters," Adv. Mater., 17(8):1059-1064 (2005).
Huang, Jinsong at al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Wong, Wai-Yeung, "Multifunctional Iridium Complexes Based on Carbazole Modules as Highly Efficient Electrophosphors," Angew, Chem. Int. Ed., 45:7800-7803 (2006).
Tang, C.W. and VanSlyke, S.A., "Organic Electroluminescent Diodes," Appl. Phys. Lett., 51(12):913-915 (1987).
Adachi, Chihaya et al., "Organic Electroluminescent Device Having a Hole Conductor as an Emitting Layer," Appl. Phys. Lett., 55(15):1489-1491 (1989).
Ma, Yuguang et al., "Triplet Luminescent Dinuclear-Gold(I) Complex-Based Light-Emitting Diodes with Low Turn-On voltage," Appl. Phys. Lett., 74(10)1 361-1363 (1999).
Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Hung, L.S. et al., "Anode Modification in Organic Light-Emitting Diodes by Low-Frequency Plasma Polymerization of $CHF_3$," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Wang, Y. et al., "Highly Efficient Electroluminescent Materials Based on Fluorinated Organometallic Iridium Compounds," Appl. Phys. Lett., 79(4):449-451 (2001).
Kwong, Raymond C. et al., "High Operational Stability of Electrophosphorescent Devices," Appl. Phys. Lett., 81(1):162-164 (2002).
Holmes, R.J. et al., "Blue Organic Electrophosphorescence Using Exothermic Host-Guest Energy Transfer," Appl. Phys. Lett., 82(15)2422-2424 (2003).
Sotoyama, Wataru et al., "Efficient Organic Light-Emitting Diodes with Phosphorescent Platinum Complexes Containing $N^{\wedge}C^{\wedge}N$-Coordinating Tridentate Ligand," Appl. Phys. Lett., 86:153505-1-153505-3 (2005).
Okumoto, Kenji et al., "Green Fluorescent Organic Light-Emitting Device with External Quantum Efficiency of Nearly 10%," Appl. Phys. Lett., 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Aonuma, Masaki et al., "Material Design of Hole Transport Materials Capable of Thick-Film Formation in Organic Light Emitting Diodes," Appl. Phys. Lett., 90:183503-1-183503-3 (2007).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Adachi, Chihaya et al., "High-Efficiency Red Electrophosphorescence Devices," Appl. Phys. Lett., 78(11):1622-1624 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Hamada, Yuji et al., "High Luminance in Organic Electroluminescent Devices with Bis(10-hydroxybenzo[h]quinolinato)beryllium as an Emitter," Chem. Lett., 905-906 (1993).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4):592-593 (2005).
Mi, Bao-Xiu et al., "Thermally Stable Hole-Transporting Material for Organic Light-Emitting Diode: an Isoindole Derivative," Chem. Mater., 15(16):3148-3151 (2003).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Niu, Yu-Hua et al., "Highly Efficient Electrophosphorescent Devices with Saturated Red Emission from a Neutral Osmium Complex," Chem. Mater., 17(13):3532-3536 (2005).
Lo, Shih-Chun et al, "Blue Phosphorescence from Iridium(III) Complexes at Room Temperature," Chem. Mater., 18(21):5119-5129 (2006).
Takizawa, Shin-ya et al., "Phosphorescent Iridium Complexes Based on 2-Phenylimidazo[1,2- α]pyridine Ligands: Tuning of Emission Color toward the Blue Region and Application to Polymer Light-Emitting Devices," Inorg. Chem., 46(10):4308-4319 (2007).
Lamansky, Sergey et al., "Synthesis and Characterization of Phosphorescent Cyclometalated Iridium Complexes," Inorg. Chem., 40(7):1704-1711 (2001).
Ranjan, Sudhir et al., "Realizing Green Phosphorescent Light-Emitting Materials from Rhenium(I) Pyrazolato Diimine Complexes," Inorg. Chem., 42(4):1248-1255 (2003).

(56) References Cited

OTHER PUBLICATIONS

Noda, Tetsuya and Shirota, Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices *Jpn. J. Appl. Phys.*, 32:L917-L920 (1993).

Van Slyke, S. A. et al., "Organic Electroluminescent Devices with Improved Stability," *Appl. Phys. Lett.*, 69(15):2160-2162 (1996).

Guo, Tzung-Fang et al., "Highly Efficient Electraphosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

* cited by examiner

TRIPLET-TRIPLET ANNIHILATION UP CONVERSION (TTA-UC) FOR DISPLAY AND LIGHTING APPLICATIONS

This application claims priority to U.S. Provisional Application Ser. No. 61/397,542, filed on Jun. 11, 2010, the disclosure of which is herein expressly incorporated in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention pertains to devices comprising a layer of compounds capable of triplet triplet annihilation up-conversion (TTA-UC) such that emission is converted to a shorter wavelength.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure:

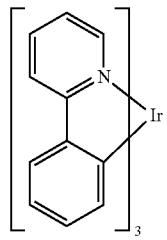

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Devices using triplet-triplet annihilation up-conversion (TTA-UC) to covert emission from a light source, e.g., an OLED, to an emission with shorter wavelength are provided. A first device is provided, comprising a first organic light emitting device comprising a first material that is an emitting material having a first emissive spectrum, and a first triplet-triplet annihilation up-conversion layer disposed adjacent to the first organic light emitting device such that light emitted by the organic light emitting device is incident on the first up-conversion layer. The first triplet-triplet annihilation up-conversion layer comprising a first donor material and a first acceptor material, and the first donor material has an absorption spectrum that overlaps with the first emissive spectrum.

In one aspect, the device further comprises a pixel, which further comprises three subpixels. The first subpixel comprises the first organic light emitting device and the first up conversion layer disposed adjacent to the first organic light emitting device. The second subpixel comprises a second organic light emitting device comprising a second material that is an emitting material having a second emissive spectrum. Preferably, the second subpixel does not include an up-conversion layer or a down conversion layer. The third subpixel comprises a third organic light emitting device comprising a third material that is an emitting material having a third emissive spectrum.

In another aspect, the third subpixel further comprises a first down conversion layer disposed adjacent to the third organic light emitting device such that light emitted by the third organic light emitting device is incident on the first down conversion layer.

In yet another aspect, the first material, the second material, and the third material have an emissive spectrum having a peak wavelength of about 500 nm to about 600 nm. Preferably, the first material, the second material, and the third material are the same material.

In a further aspect, the first and the second materials have an emissive spectrum having a peak wavelength of about 500 nm to about 600 nm, and the third material has an emissive spectrum having a peak wavelength of about 600 nm to about 700 nm. Preferably, the second subpixel does not comprise an up-conversion layer or a down conversion layer.

In one aspect, the first subpixel has an emissive spectrum that has a peak wavelength of about 400 nm to about 500 nm, the second subpixel has an emissive spectrum that has a peak wavelength of about 500 nm to about 600 nm, and the third subpixel has an emissive spectrum that has a peak wavelength of about 600 nm to about 700 nm.

In another aspect, the first material, the second material, and the third material have an emissive spectrum having a peak wavelength of about 500 nm to about 600 nm. In the first subpixel, the first material emits light having a peak wavelength of about 500 to about 600 nm. The first up-conversion layer absorbs light having a peak wavelength of about 500 nm to about 600 nm and emits light having a peak wavelength of about 400 nm to about 500 nm, such that the first subpixel emits light having a peak wavelength of about 400 nm to about 500 nm. The second subpixel does not include an up-conversion or a down conversion layer, and the second material emits light having a peak wavelength of about 500 nm to about 600 nm, such that the second subpixel emits light having a wavelength of about 500 nm to about 600 nm. The third subpixel includes a down conversion layer, which absorbs light having a peak wavelength of about 500 nm to about 600 nm and emits light having a peak wavelength of about 600 nm to about 700 nm, such that the third subpixel emits light having a peak wavelength of about 600 nm to about 700 nm. Preferably, the first material, the second material, and the third material are the same material.

In one aspect, the first triplet-triplet annihilation up-conversion layer absorbs between about 80 percent and about 100 percent of the light emitted from the organic light emitting device.

In another aspect, the device further comprises at least one filter that absorbs light having a peak wavelength of about 500 nm to about 600 nm.

In yet another aspect, the device further comprises at least one microcavity that absorbs light having a peak wavelength of about 500 nm to about 600 nm.

In a further aspect, the device absorbs 99 percent of the emitted light emitted by the first material.

In one aspect, the organic light emitting device is capable of emitting a first spectrum of light having a first peak wavelength when voltage is applied to the device. The first triplet-triplet annihilation up-conversion layer is capable of absorbing the first spectrum of light and emitting a second spectrum of light with a second peak wavelength. The second peak wavelength is shorter than the first peak wavelength.

In another aspect, the first triplet-triplet annihilation up-conversion layer absorbs between about 20 percent and about 80 percent of the light emitted by the first material.

In one aspect, the device has CIE coordinates of x=0.10-0.40, y=0.05-0.40.

In another aspect, the device has a CRI of about 80 to about 100.

In one aspect, the first triplet-triplet annihilation up-conversion layer is a solution. In another aspect, the first triplet-triplet annihilation up-conversion layer is a solid film.

In one aspect, the light source is a green organic light emitting device or red organic light emitting device.

In another aspect, the first material emits light having CIE coordinates of within a seven step McAdam ellipse centered on the black body curve with a correlated color temperature (CCT) in the range of 2500-7400K, and the first device emits light having CIE coordinates of within a seven step McAdam ellipse centered on the black body curve with a correlated color temperature (CCT) at least 50K higher than that of the emission of the first material.

In yet another aspect, the first material emits light having a peak wavelength of about 500 nm to about 700 nm, and the first device emits light having CIE coordinates of within a seven step McAdam ellipse centered on the black body curve with a correlated color temperature (CCT) in the range of 2500-7000K.

In one aspect, the first device further comprises a filter deposited over the organic light emitting device.

In one aspect, the first device is an area emitting device.

In one aspect, the first triplet-triplet annihilation up-conversion layer and the organic light emitting device are deposited on the same substrate. In another aspect, the first triplet-triplet annihilation up-conversion layer is vertically-stacked upon the organic light emitting device. In yet another aspect, the first triplet-triplet annihilation up-conversion layer and the organic light emitting device are positioned side by side.

In one aspect, the first device is a display. In another aspect, the first device is suitable for general illumination purposes.

In one aspect, the first triplet-triplet annihilation up-conversion layer has a linear or circular light polarization function.

In one aspect, the first material is a small molecule. In another aspect, the first material is a phosphorescent molecule.
In one aspect, up-conversion is achieved through triplet-triplet annihilation.
In one aspect, the first donor materials are selected from the group consisting of:
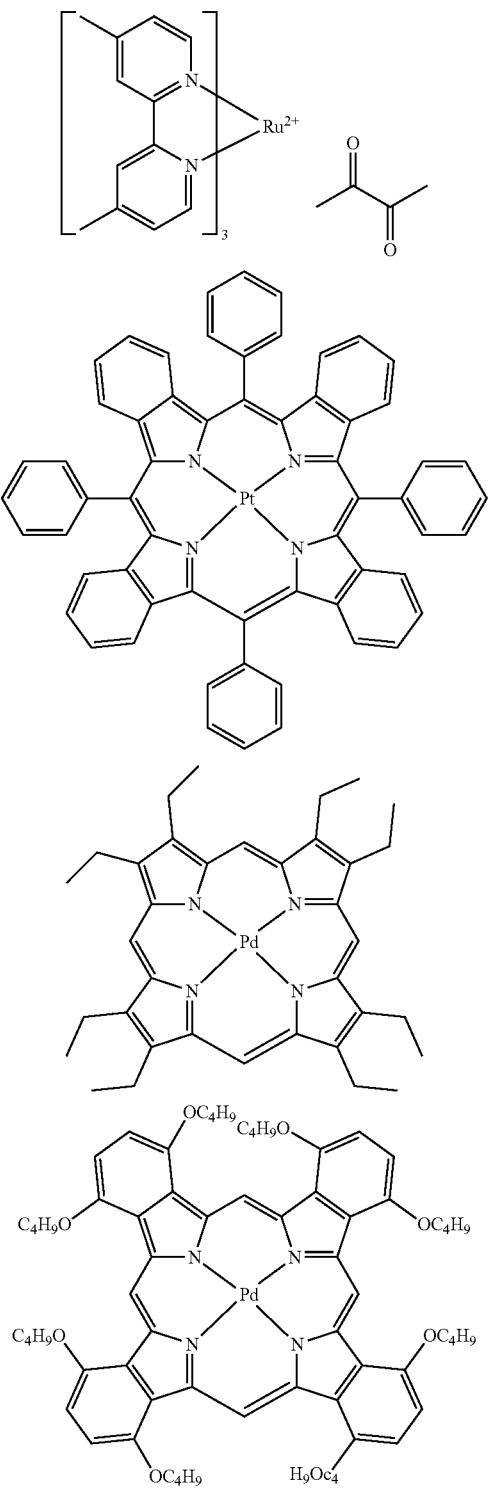
-continued
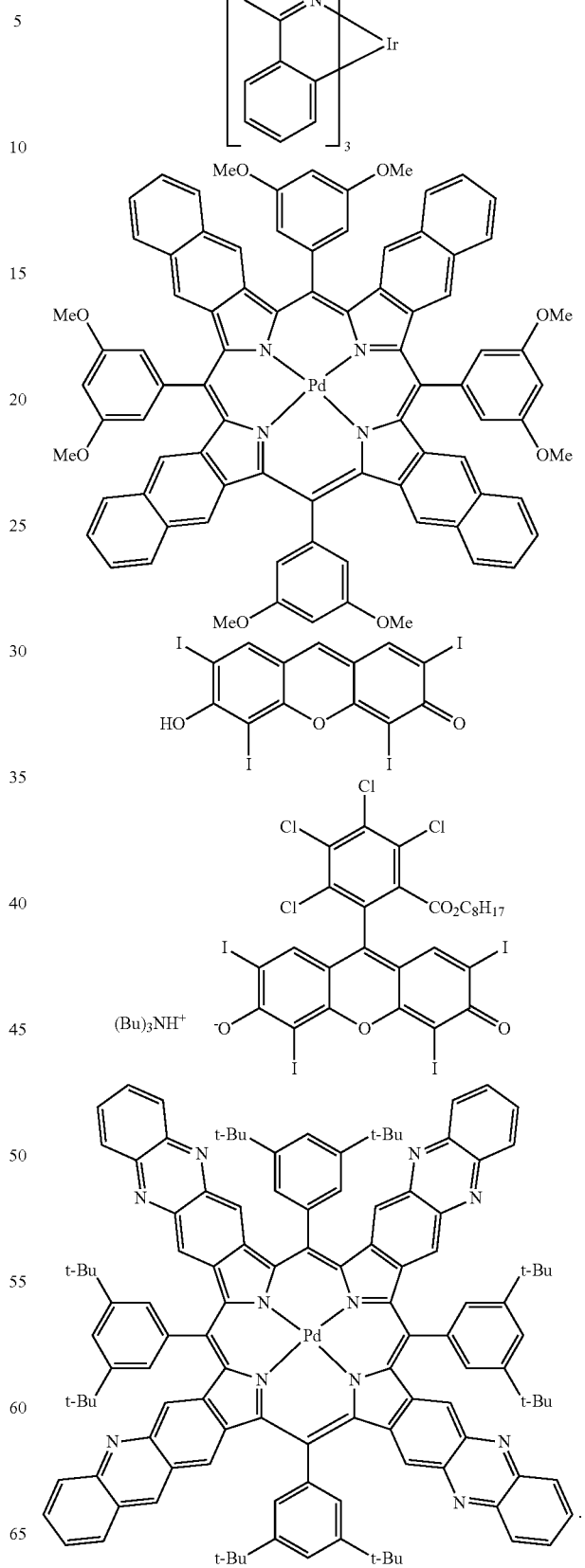

The first donor materials may be substituted or unsubstituted.
In another aspect, the first acceptor materials are selected from the group consisting of:
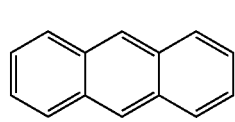 [SMILES: c1ccc2cc3ccccc3cc2c1] 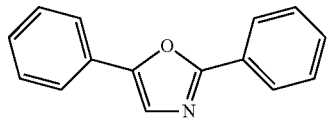 [SMILES: c1ccc(-c2cnc(-c3ccccc3)o2)cc1]
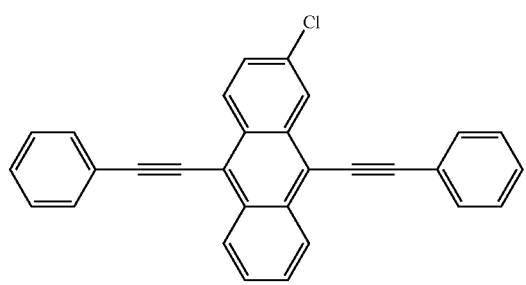 [SMILES: Clc1ccc2c(C#Cc3ccccc3)c3ccccc3c(C#Cc3ccccc3)c2c1]
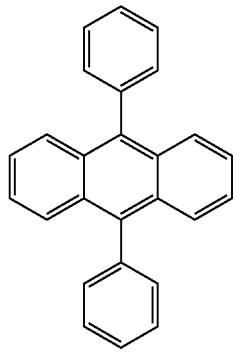 [SMILES: c1ccc(-c2c3ccccc3c(-c3ccccc3)c3ccccc23)cc1] 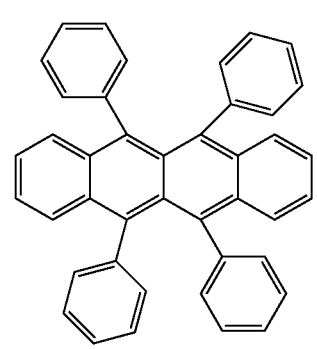 [SMILES: c1ccc(-c2c3ccccc3c(-c3ccccc3)c3c(-c4ccccc4)c4ccccc4c(-c4ccccc4)c23)cc1]
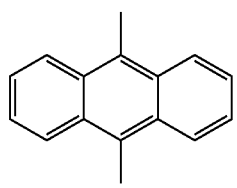 [SMILES: Cc1c2ccccc2c(C)c2ccccc12] 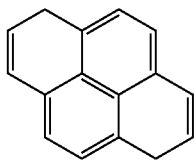 [SMILES: C1=Cc2ccc3c4c(ccc(c24)C1)C=CC3]
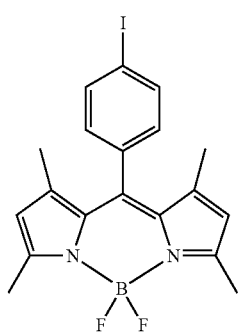 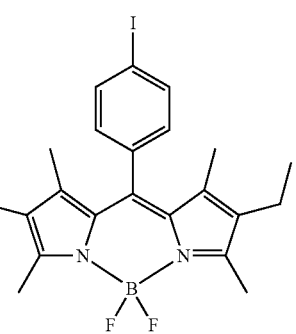
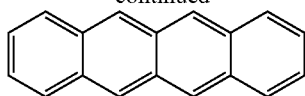
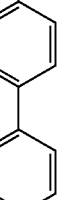
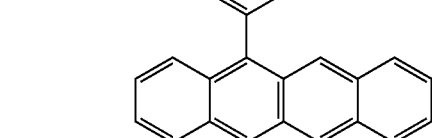
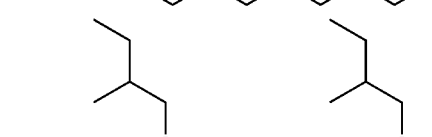
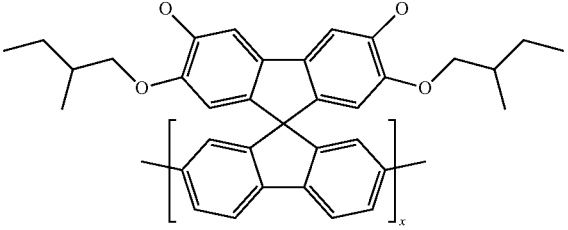
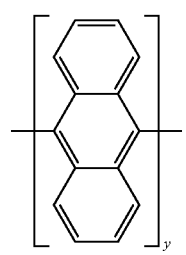
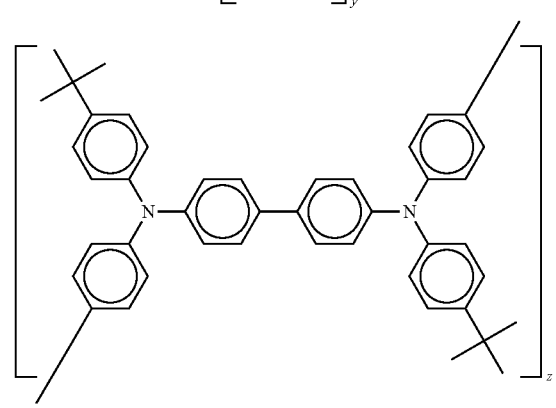
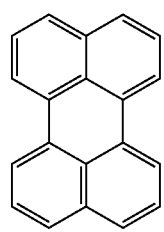

The first acceptor materials may be substituted or unsubstituted.

Methods of operating a device are also provided. The methods comprise driving an organic light emitting device to generate light, absorbing the light in a first triplet-triplet annihilation up-conversion layer, shortening the wavelength of the light using triplet-triplet annihilation up-conversion, and emitting the light.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
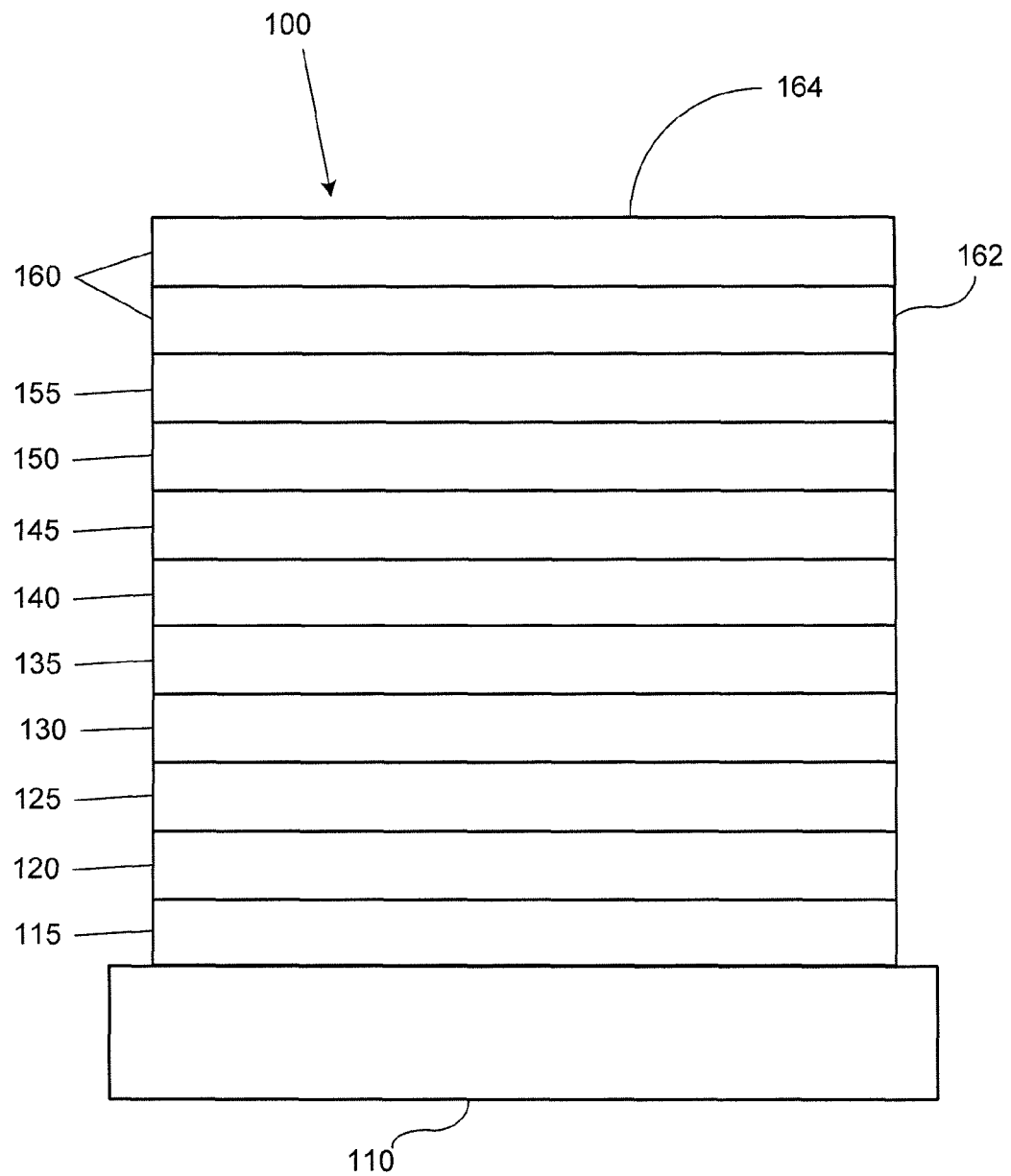
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
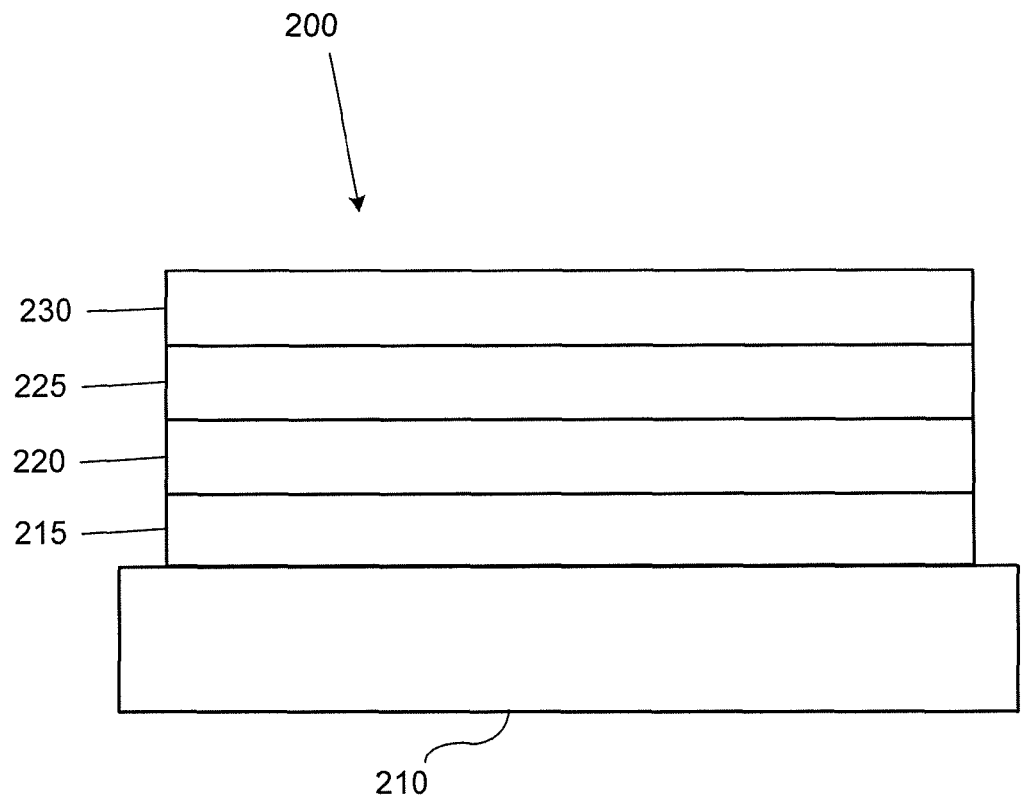
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
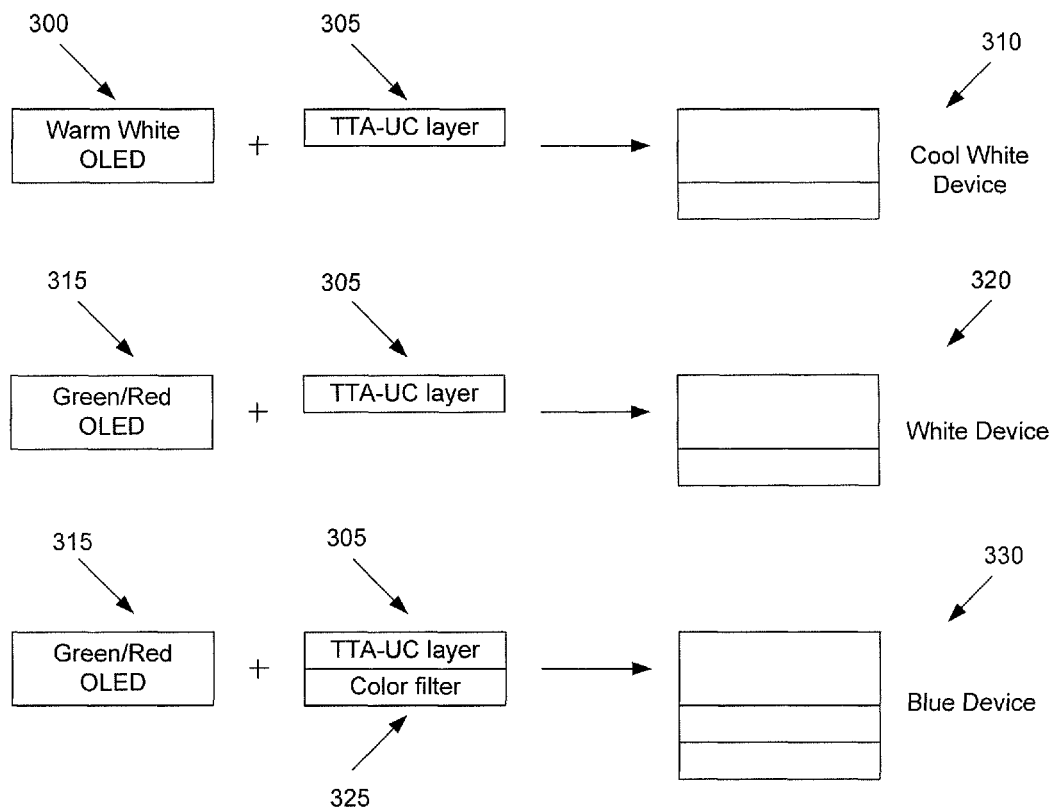
FIG. 3 shows various devices using the TTA-UC process.

This invention discloses a new method of achieving white OLEDs and blue/green OLEDs through a triplet-triplet annihilation up-conversion process (TTA-UC) (illustrated in FIG. 3). A solution or solid film that contains compounds with capability of TTA-UC can be placed adjacent to an OLED device. During the operation of the OLED, the TTA-UC system partially converts the emission from the OLED to an emission with shorter wavelength.

Photon up-conversion based on triplet-triplet annihilation (TTA) has emerged as a promising wavelength-shifting technology. The sensitized TTA mechanism allows the use of low power non-coherent continuous-wave excitation sources. In this sensitized TTA process, short wavelength photons are produced from the absorption of lower energy light by triplet sensitizers. The sensitizers then transfer the energy to the acceptor molecules. Two triplets can collide and produce a higher energy excited singlet state and the corresponding ground-state species. The excited single state can undergo radiative decay, giving out a photon that is significantly higher in energy than the exciting light. Historically, TTA-UC was used for organic solar cell technology. An up-converter may be needed to increase the number of photons with shorter wavelengths, which the organic solar panel is capable of absorbing.

Additionally, the use of TTA to up-convert electrically generated triplets has been reported in the art. See, e.g., D. Y. Kondakov, et al., Triplet annihilation exceeding spin statistical limit in highly efficient fluorescent organic light-emitting diodes, J. Appl. Phys. 106, 124510 (2009). Embodiments of the invention disclosed herein include TTA-UC of photogenerated triplets, rather than electrically generated triplets.

It has been reported in the art to introduce various heavy metal-containing sensitizers such as iridium and platinum complexes. Red to green, red to blue, and green to blue up conversion have been achieved using different systems. Photon up-conversion using TTA has been demonstrated in both dilute solutions and solid films. For example, Castellano et al reported a TTA system with Pd(OEP), DPA and poly(EO-EPI). They have shown that selective green excitation (544 nm) of palladium(II) octaethylporphyrin (PdOEP) leads to triplet sensitization of 9,10-diphenylanthracene (DPA), eventually producing blue singlet DPA fluorescence (400-525 nm) in these films. The chemical structures of (a) PdOEP, (b) DPA, and (c) EO-EPI, are shown below.

(a)(b)(c)

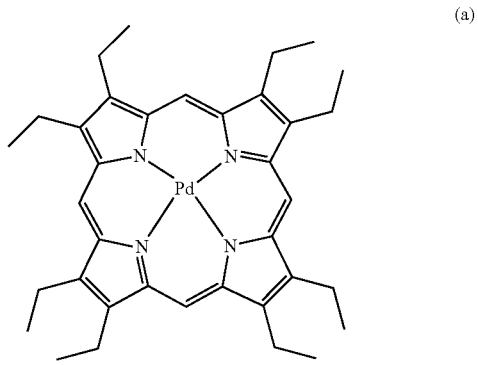

(a)

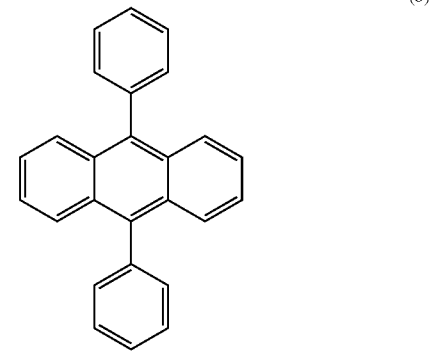

(b)

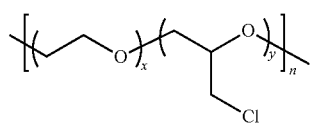

(c)

A polyfluorene copolymer and heavy metal containing sensitizer for TTA up conversion has been reported. See US20080103279. By introducing a condensed ring system in the polymer chain, TTA can be greatly enhanced and it is possible to use this system in a semiconductor device and obtain improved performance. See, US20080103279 and Kondakov et al., Triplet annihilation exceeding spin statistical limit in highly efficient fluorescent organic light-emitting diodes, J. Appl. Phys. 106, 124510 (2009).

A light emitting device using a semiconductor light emitting device based on inorganic rare earth metal compounds with an up-converting material disposed in the path of the emission from the semiconductor light emitting device has also been described in the art. See, U.S. Pat. No. 7,471,706. However, there are inherent limitations to the device and methods described, including poor efficiency of less than 10% due to several steps of energy transfer. Therefore, it may be difficult to achieve highly efficient displays with RGB up-converting systems. In addition, the inorganic rare earth metal device also requires a coherent light source, which further limits the usefulness of the device. See, Journal of Display Technology, 2, 68 (2006).

Embodiments of the prevent invention use triplet-triplet annihilation for up conversion, and up to 60% efficiency has been reported for TTA-UC. See, J. Phys. Chem. Lett. 1, 1795 (2010). Therefore, TTA up-conversion may be more efficient than rare earth up conversion system. In addition, a coherent light source is not required for TTA-UC. Furthermore, in the display architecture disclosed in embodiments of this invention, only the blue pixel was based on up-conversion, therefore the display may be reasonably efficient.

Although steady progress in the development of blue OLEDs has been made during the past two decades, the lifetime of blue devices still lags behind that of green and red OLEDs. Embodiments of the current invention provide a method of producing shorter wavelength emission from an OLED with longer wavelength emission. In particular, embodiments of the invention provide a method of producing blue light from a red or green OLED. This invention may overcome the problem of short lifetimes commonly seen in blue OLEDs. Additionally, embodiments of the invention provide an alternative to using less stable blue compounds in a device.

As disclosed herein, an OLED device is coupled with a solution or thin film, which contains compounds that can undergo TTA up-conversion. The OLED provides an excitation light source. The TTA media can absorb the light and convert it to shorter wavelength emission. For example, blue emission can be obtained by using a green OLED or red OLED with a TTAUC layer. Long device operational lifetime can be achieved using these devices.

These devices using TTA-UC may have several applications. For example, it can be used to achieve cool white OLEDs, i.e., high correlated color temperature, using a warm white OLED, i.e., low correlated color temperature. The blue part of the spectrum can be generated from the TTA-UC. Furthermore, a white OLED can be obtained with a green/red OLED and a TTA-UC layer. It can also be used to generate monochrome blue light if a filter is used. The general concept is illustrated in FIG. 3, showing a cool white device 310, a white device 320 and a blue device 330. In one embodiment, a warm white OLED 300 and a TTA-UC layer 305 are stacked to form cool white device 310. In another embodiment, a green or red OLED 315 and a TTA-UC layer 305 are stacked to form white device 320. In a further embodiment, a green or red OLED 315, a TTA-UC layer 305 and a color filter 325 are stacked to form blue device 320.

Devices using triplet-triplet annihilation up conversion (TTA-UC) to covert emission from a light source, e.g., an OLED, to an emission with shorter wavelength are provided. A first device is provided, comprising a first organic light emitting device comprising a first material that is an emitting material having a first emissive spectrum, and a first triplet-triplet annihilation up-conversion layer disposed adjacent to the first organic light emitting device such that light emitted by the organic light emitting device is incident on the first up-conversion layer. The first triplet-triplet annihilation up-conversion layer comprising a first donor material and a first acceptor material, and the first donor material has an absorption spectrum that overlaps with the first emissive spectrum.

A variety of donor and acceptor materials may be suitable for use in these devices. Non-limiting examples of compounds that may be used in the up-conversion layer include those listed below in Table 1.

TABLE 1

| Donor | Acceptor | $\lambda_{excitation}$ (nm) | $\lambda_{emission}$ (nm) | Reference |
|---|---|---|---|---|
| [Ru(dmb)3]2+ | anthracene | 514.5 | 400 | Chem. Comm. 2005, 3776-3777 |

TABLE 1-continued
| Donor | Acceptor | λ_excitation (nm) | λ_emission (nm) | Reference |
|---|---|---|---|---|
| 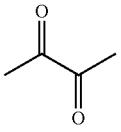 Biacetyl | 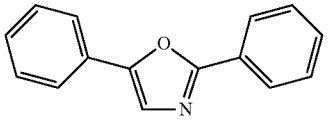 PPO | 442 | 360 | J. Phys. Chem. A 2009, 113, 5912-5917 |
| 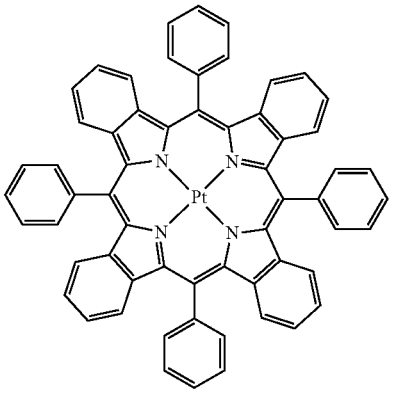 PtTPBP | 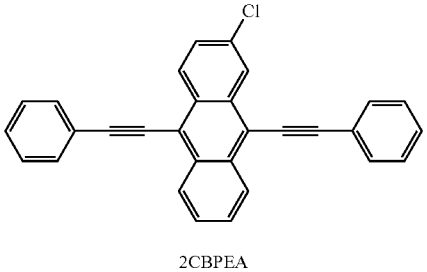 2CBPEA | 635 | 490 | Inorg. Chem. 2009, 48, 2541-2548 |
| 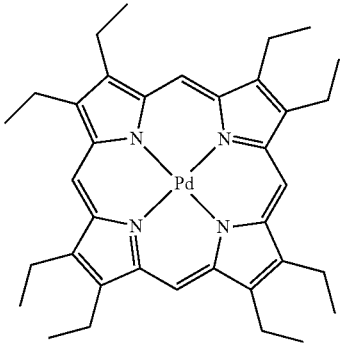 PDOEP | 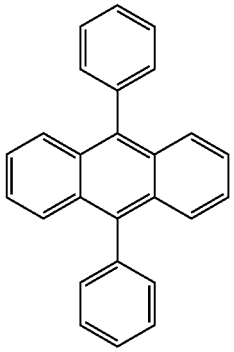 DPA | 544 | 445 | J. Am. Chem. Soc. 2007, 129, 12652-12653 |
| 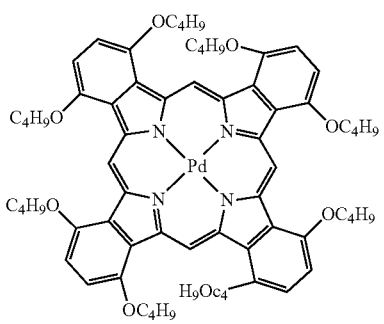 PdPc( )Bu)8 | 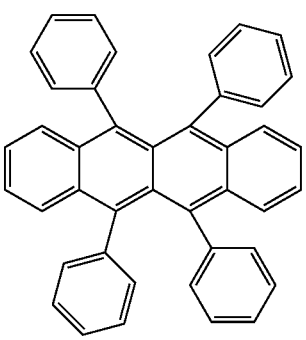 Rubrene | 725 | 560 | J. Phys. Chem. A 2008, 112, 3550-3556 |

TABLE 1-continued

| Donor | Acceptor | λ_excitation (nm) | λ_emission (nm) | Reference |
|---|---|---|---|---|
| [Ru(dmb)3]2+ | DMA | 514.5 | 431 | *J. Phys. Chem. A* 2008, 112, 3906-3910 |
| Ir(ppy)3 | pyrene | 450 | 390 | *J. Phys. Chem. A* 2006, 110, 11440-11445 |
| PtTPBP | BD-1 | 635 | 527 | *J. Am. Chem. Soc.* 2008, 130, 16164-16165 |
| [Ru(dmb)3]2+ | DPA | 514.5 | 445 | *Chem. Comm.* 2005, 3776-3777 |

TABLE 1-continued
| Donor | Acceptor | λ_excitation (nm) | λ_emission (nm) | Reference |
|---|---|---|---|---|
| 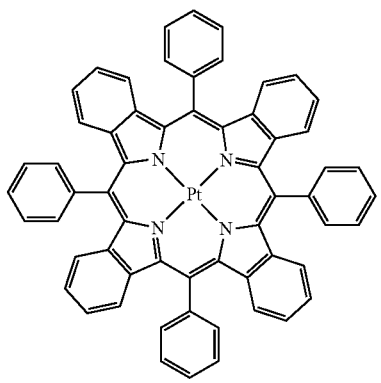 PtTPBP | 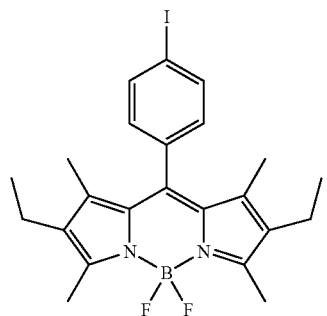 BD-2 | 635 | 556 | *J. Am. Chem. Soc.* 2008, 130, 16164-16165 |
| 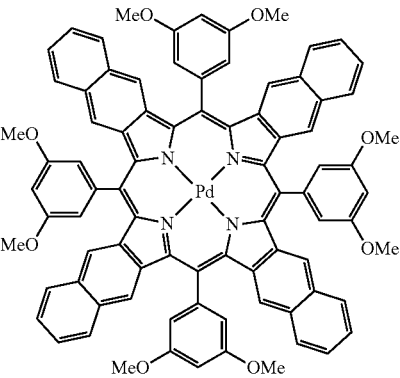 | 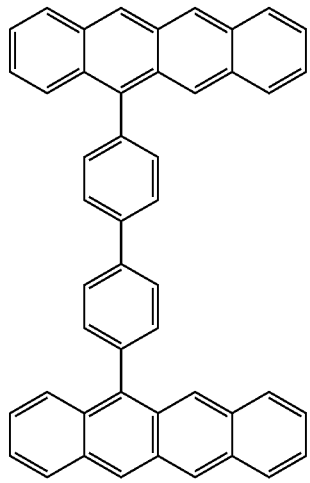 [SMILES: c1ccc2cc3c(-c4ccc(-c5ccc(-c6c7ccccc7cc7cc8ccccc8cc67)cc5)cc4)c4ccccc4cc3cc2c1] | 695 | 500 | *Angew. Chem. Int. Ed.* 2007, 46, 7693-7696 |
| 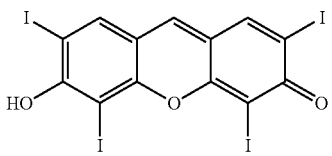 [SMILES: O=c1c(I)cc2cc3cc(I)c(O)c(I)c3oc-2c1I] TIHF | 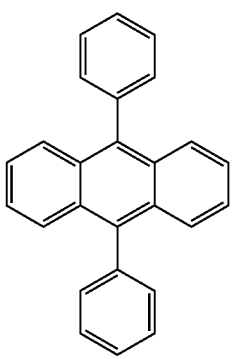 DPA | 532 | 445 | *Chem. Commun.* 2009, 4064-4066 |

TABLE 1-continued
| Donor | Acceptor | $\lambda_{excitation}$ (nm) | $\lambda_{emission}$ (nm) | Reference |
|---|---|---|---|---|
| 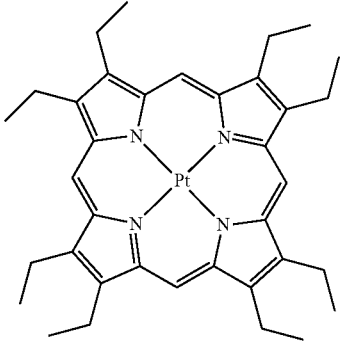 PTOEP | 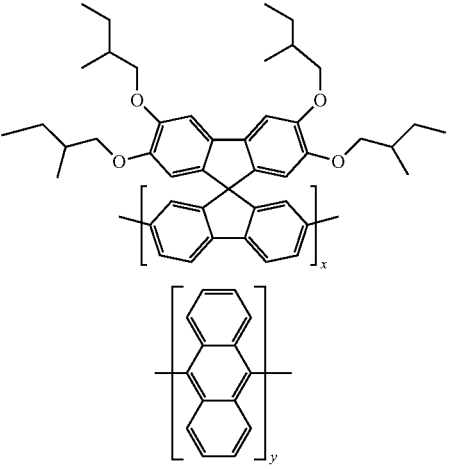 X = 0.6, y = 0.3, z = 0.1 PF | 537 | 420 | THE JOURNAL OF CHEMICAL PHYSICS 2005, 123, 074902 |
| 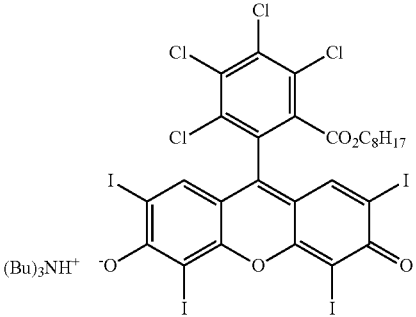 RBOE | 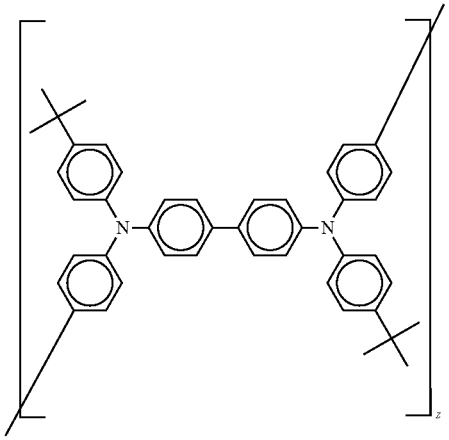 PPO | 410 | 360 | Journal of Luminescence 2009, 129, 303-306 |

TABLE 1-continued

| Donor | Acceptor | $\lambda_{excitation}$ (nm) | $\lambda_{emission}$ (nm) | Reference |
|---|---|---|---|---|
| 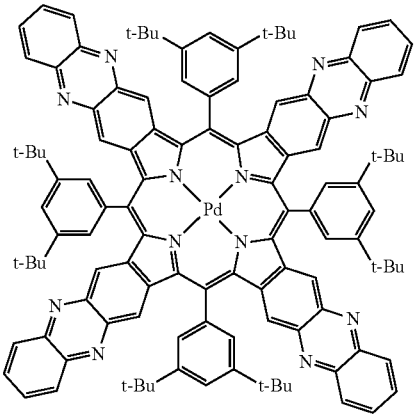<br>PQ$_4$Pd | 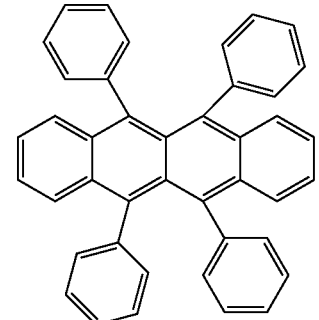<br>Rubrene | 700 | 560 | J. Phys. Chem. Lett. 2010, 1, 1795-1799 |
| 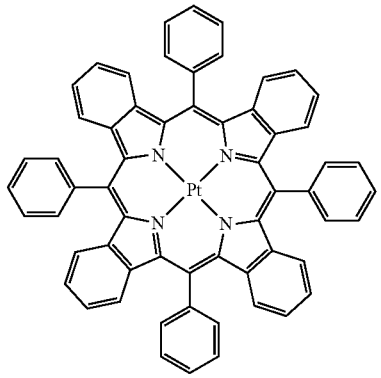<br>PtTPBP | 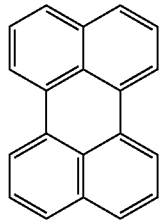<br>perylene | 635 | 445 | J. Phys. Chem. Lett. 2010, 1, 195-200 |

Figure 4:
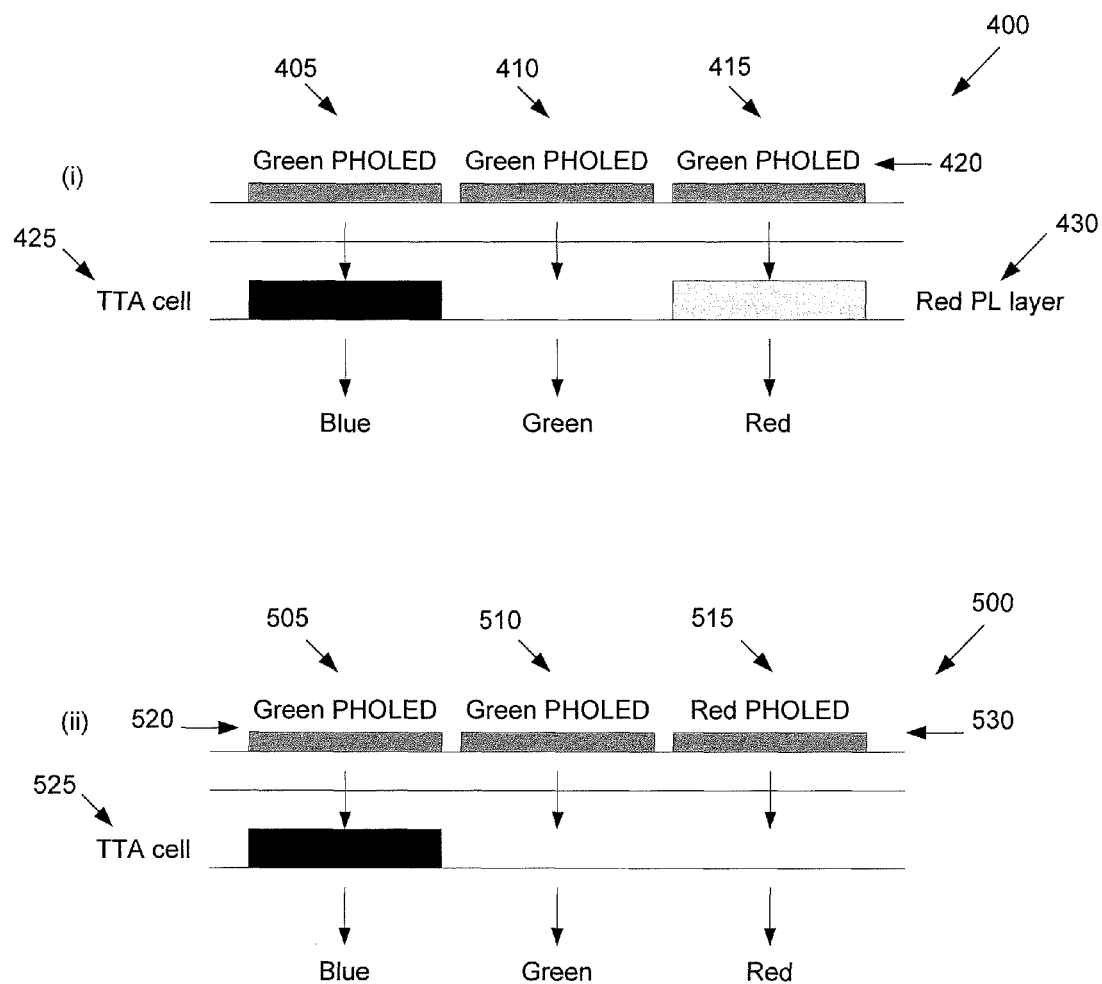
FIG. 4 shows various devices with different pixel architecture.

In one aspect, the device further comprises a pixel, which further comprises three subpixels (illustrated in FIG. 4). The first subpixel comprises the first organic light emitting device and the first up-conversion layer disposed adjacent to the first organic light emitting device. The second subpixel comprises a second organic light emitting device comprising a second material that is an emitting material having a second emissive spectrum. Preferably, the second subpixel does not include an up-conversion layer or a down-conversion layer. The third subpixel comprises a third organic light emitting device comprising a third material that is an emitting material having a third emissive spectrum. For example, device 400 comprises three subpixels 405, 410 and 415, each of which emits a different color light. The first subpixel 405 comprises a green PHOLED 420 and an up-conversion layer 425. Green light emitted from the green PHOLED 420 is absorbed by the up-conversion layer 425, and emitted as blue light. The second subpixel 410 comprises a green PHOLED 420. Green light emitted from the green PHOLED 420 is not absorbed by an up-conversion layer or a down-conversion layer, resulting in green emission. The third subpixel 415 comprises a green PHOLED 420 and a down-conversion layer 430. Green light emitted from the green PHOLED 420 is absorbed by the down-conversion layer 430, and emitted as red light. Preferably, each of the green PHOLEDS 420 in subpixels 405, 410 and 415 are made from the same materials and have the same device structure, thereby allowing the device 400 having red, green and blue emission to be manufactured using the device architecture and materials of a single green PHOLED.

Device 500 also contains three subpixels 505, 510 and 515, each of which emits a different color light, but device 500 has a different device architecture than device 400. The first subpixel 505 comprises a green PHOLED 520 and an up-conversion layer 525. Green light emitted from the green PHOLED 520 is absorbed by the up-conversion layer 525, and emitted as blue light. The second subpixel 510 comprises a green PHOLED 520. Green light emitted from the green PHOLED 520 is not absorbed by an up-conversion layer or a down-conversion layer, resulting in green emission. The third subpixel 515 comprises a red PHOLED 530. Red light emitted from the red PHOLED 530 is not absorbed by an up-conversion layer or a down-conversion layer, resulting in red emission. Preferably, each of the green PHOLEDS 520 in subpixels 505 and 510 are made from the same materials and have the same device structure, thereby allowing the blue and green emission of device 500 to be manufactured using the device architecture and materials of a single green PHOLED.

In another aspect, the third subpixel further comprises a first down conversion layer disposed adjacent to the third organic light emitting device such that light emitted by the third organic light emitting device is incident on the first down conversion layer.

In yet another aspect, the first material, the second material, and the third material have an emissive spectrum having a peak wavelength of about 500 nm to about 600 nm. Preferably, the first material, the second material, and the third material are the same material.

In a further aspect, the first and the second materials have an emissive spectrum having a peak wavelength of about 500 nm to about 600 nm, and the third material has an emissive spectrum having a peak wavelength of about 600 nm to about 700 nm. Preferably, the second subpixel does not comprise an up-conversion layer or a down conversion layer.

In one aspect, the first subpixel has an emissive spectrum that has a peak wavelength of about 400 nm to about 500 nm, the second subpixel has an emissive spectrum that has a peak wavelength of about 500 nm to about 600 nm, and the third subpixel has an emissive spectrum that has a peak wavelength of about 600 nm to about 700 nm.

In another aspect, the first material, the second material, and the third material have an emissive spectrum having a peak wavelength of about 500 nm to about 600 nm. In the first subpixel, the first material emits light having a peak wavelength of about 500 to about 600 nm. The first up-conversion layer absorbs light having a peak wavelength of about 500 nm to about 600 nm and emits light having a peak wavelength of about 400 nm to about 500 nm, such that the first subpixel emits light having a peak wavelength of about 400 nm to about 500 nm. The second subpixel does not include an up-conversion or a down conversion layer, and the second material emits light having a peak wavelength of about 500 nm to about 600 nm, such that the second subpixel emits light having a wavelength of about 500 nm to about 600 nm. The third subpixel includes a down conversion layer, which absorbs light having a peak wavelength of about 500 nm to about 600 nm and emits light having a peak wavelength of about 600 nm to about 700 nm, such that the third subpixel emits light having a peak wavelength of about 600 nm to about 700 nm. Preferably, the first material, the second material, and the third material are the same material.

In one aspect, the first triplet-triplet annihilation up-conversion layer absorbs between about 80 percent and about 100 percent of the light emitted from the organic light emitting device.

In another aspect, the device further comprises at least one filter that absorbs light having a peak wavelength of about 500 nm to about 600 nm.

In yet another aspect, the device further comprises at least one microcavity that absorbs light having a peak wavelength of about 500 nm to about 600 nm.

In a further aspect, the device absorbs 99 percent of the emitted light emitted by the first material.

In one aspect, the organic light emitting device is capable of emitting a first spectrum of light having a first peak wavelength when voltage is applied to the device. The first triplet-triplet annihilation up-conversion layer is capable of absorbing the first spectrum of light and emitting a second spectrum of light with a second peak wavelength. The second peak wavelength is shorter than the first peak wavelength.

In another aspect, the first triplet-triplet annihilation up-conversion layer absorbs between about 20 percent and about 80 percent of the light emitted by the first material.

In one aspect, the device has CIE coordinates of x=0.10-0.40, y=0.05-0.40.

In another aspect, the device has a CRI of about 80 to about 100.

In one aspect, the first triplet-triplet annihilation up-conversion layer is a solution. In another aspect, the first triplet-triplet annihilation up-conversion layer is a solid film.

In one aspect, the light source is a green organic light emitting device or red organic light emitting device.

In another aspect, the first material emits light having CIE coordinates of within a seven step McAdam ellipse centered on the black body curve with a correlated color temperature (CCT) in the range of 2500-7400K and the first device emits light having CIE coordinates of within a seven step McAdam ellipse centered on the black body curve with a correlated color temperature (CCT) at least 50K higher than that of the emission of the first material.

In yet another aspect, the first material emits light having a peak wavelength of about 500 nm to about 700 nm, and the first device emits light having CIE coordinates of within a seven step McAdam ellipse centered on the black body curve with a correlated color temperature (CCT) in the range of 4000-7000K.

In one aspect, the first device further comprises a filter deposited over the organic light emitting device.

In one aspect, the first device is an area emitting device.

In one aspect, the first triplet-triplet annihilation up-conversion layer and the organic light emitting device are deposited on the same substrate. In another aspect, the first triplet triplet annihilation up-conversion layer is vertically-stacked upon the organic light emitting device. In yet another aspect, the first triplet-triplet annihilation up-conversion layer and the organic light emitting device are positioned side by side.

In one aspect, the first device is a display. In another aspect, the first device is suitable for general illumination purposes.

In one aspect, the first triplet-triplet annihilation up-conversion layer has a linear or circular light polarization function.

In one aspect, the first material is a small molecule. In another aspect, the first material is a phosphorescent molecule.

In one aspect, up-conversion is achieved through triplet-triplet annihilation.

In one aspect, the first donor materials are selected from the group consisting of:

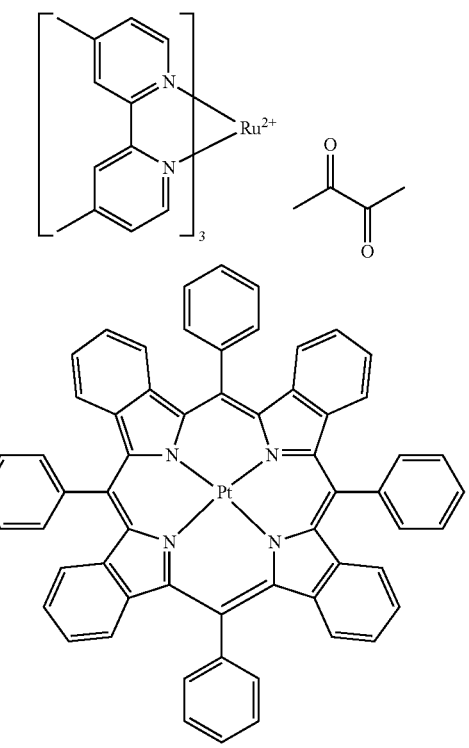

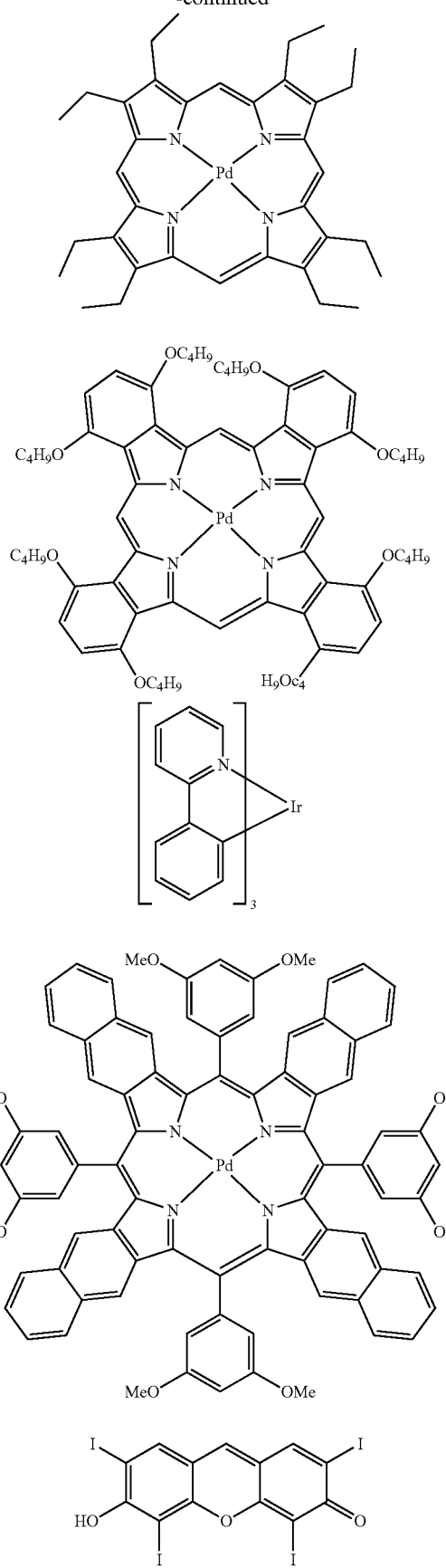
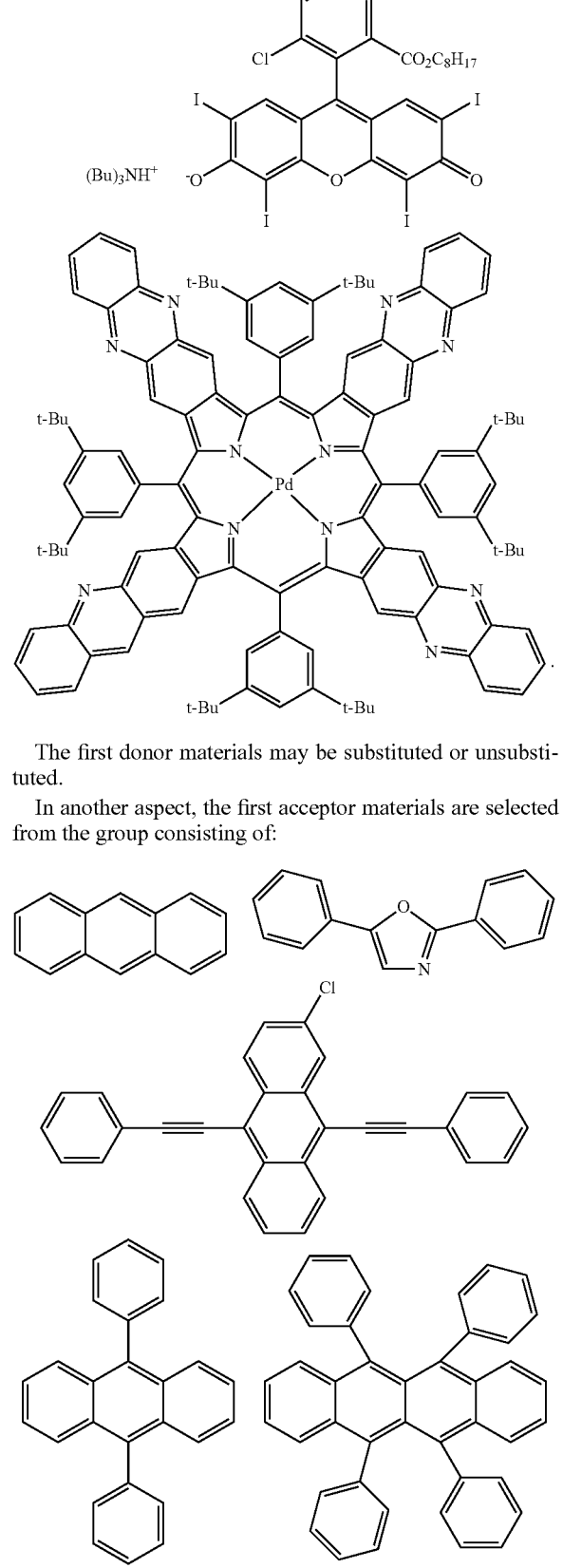
The first donor materials may be substituted or unsubstituted.
In another aspect, the first acceptor materials are selected from the group consisting of:

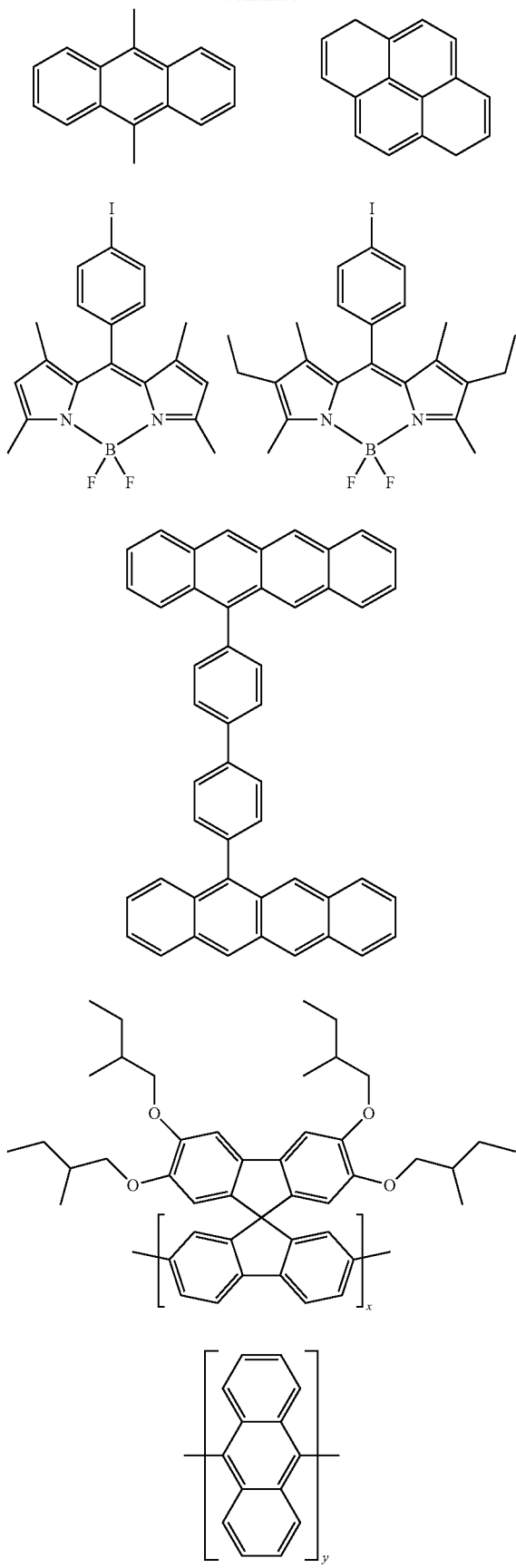
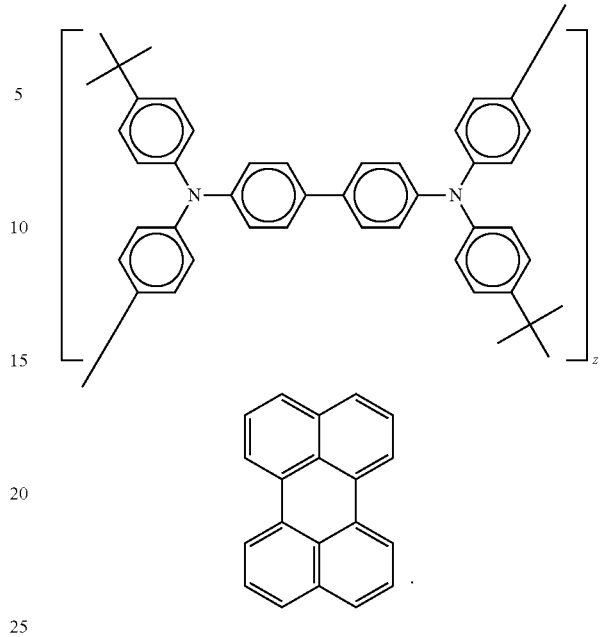

The first acceptor materials may be substituted or unsubstituted.

Methods of operating a device are also provided. The methods comprise driving an organic light emitting device to generate light, absorbing the light in a first up-conversion layer, shortening the wavelength of the light using triplet-triplet annihilation up-conversion, and emitting the light.

Combination with Other Materials

The materials described herein as useful for a particular layer in an organic light emitting device as incident light source for up-conversion may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in embodiments of the present invention is not particularly limited, and any compound may be used as long as the compound is typically used as a hole injecting/transporting material. Examples of the material include, but are not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but are not limited to the following general structures:

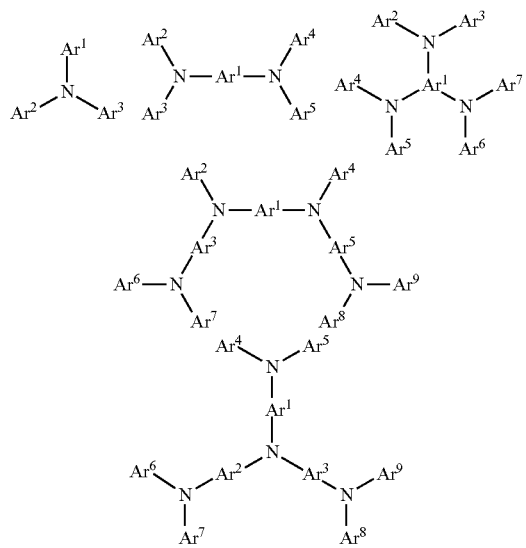

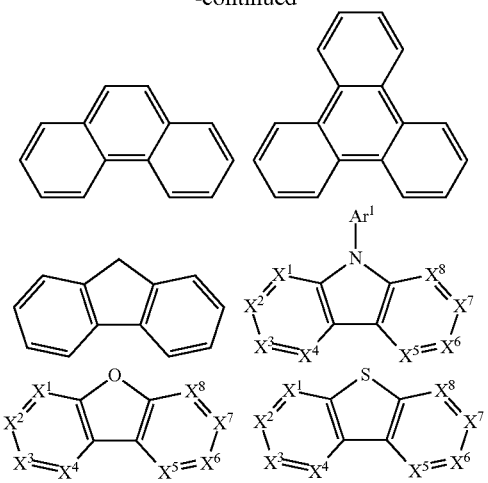

k is an integer from 1 to 20; $X^1$ to $X^8$ is CH or N; $Ar^1$ has the same group defined above.

Examples of metal complexes used in HIL or HTL include, but are not limited to the following general formula:

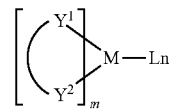

M is a metal, having an atomic weight greater than 40; $(Y^1-Y^2)$ is a bidentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.

In another aspect, $(Y^1-Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device in embodiments of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

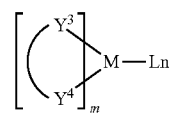

M is a metal; $(Y^3-Y^4)$ is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, alkyl, alkoxy, amino, alkenyl, alkynyl, arylalkyl, heteroalkyl, aryl and heteroaryl.

In one aspect, $Ar^1$ to $Ar^9$ is independently selected from the group consisting of:

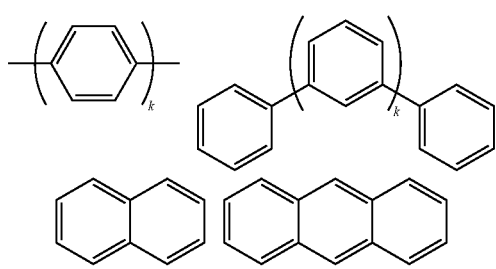

In one aspect, the metal complexes are:

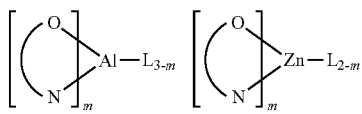

(O—N) is a bidentate ligand, having metal coordinated to atoms O and N.

In another aspect, M is selected from Ir and Pt.

In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, alkyl, alkoxy, amino, alkenyl, alkynyl, arylalkyl, heteroalkyl, aryl and heteroaryl.

In one aspect, host compound contains at least one of the following groups in the molecule:

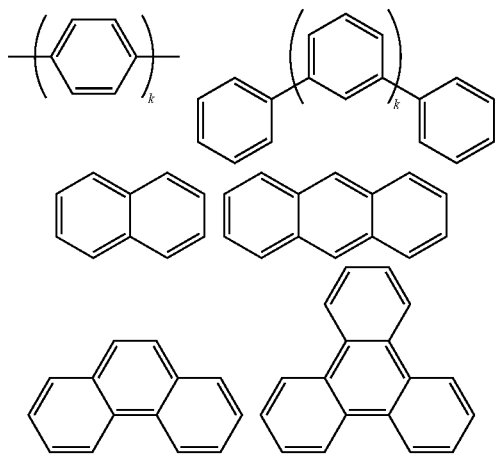

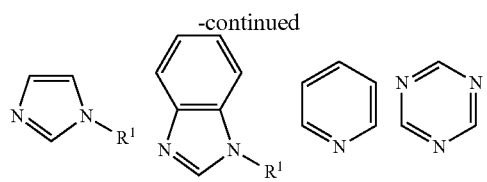

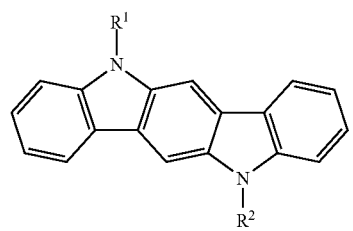

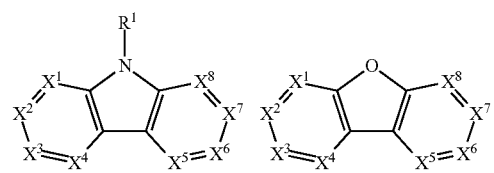

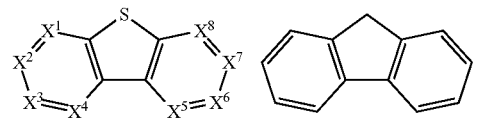

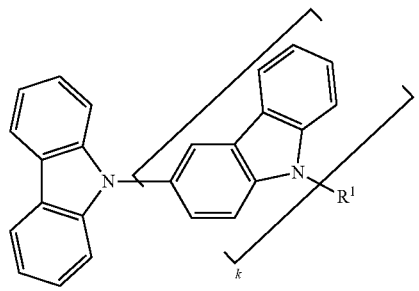

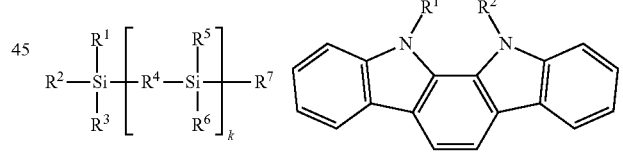

$R^1$ to $R^7$ is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

$X^1$ to $X^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

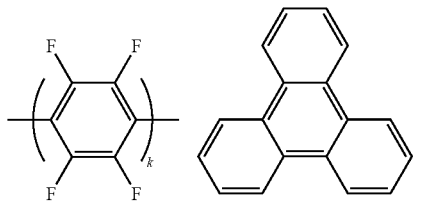

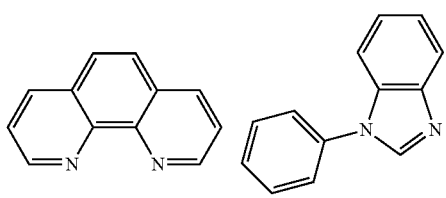

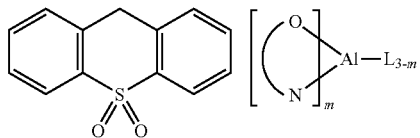

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

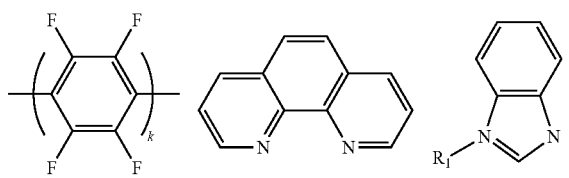

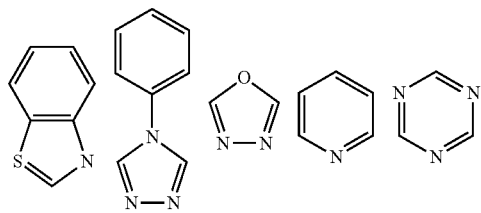

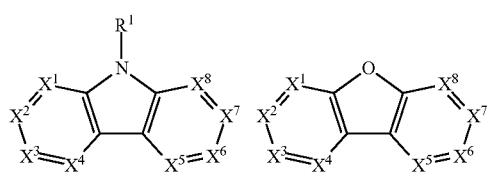

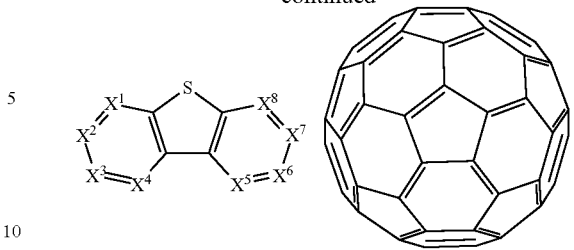

$R^1$ is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but are not limited to the following general formula:

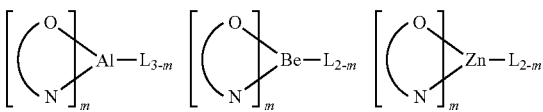

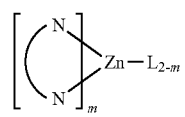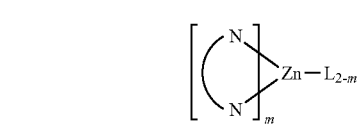

(O—N) or (N—N) is a bidentate ligand, having metal coordinated to atoms O, N or N, N; L is an ancillary ligand; m is an integer value from 1 to the maximum number of ligands that may be attached to the metal.

In any of the above-mentioned compounds used in each layer of OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 2 below. Table 2 lists non-limiting classes of materials, non-limiting examples of compounds for each class, and references that disclose the materials.

TABLE 2
| MATERIAL | EXAMPLES OF MATERIAL | PUBLICATIONS |
|---|---|---|
| Hole injection materials | | |
| Phthalocyanine and porphryin compounds | 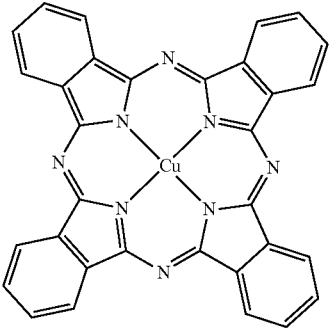 | Appl. Phys. Lett. 69, 2160 (1996) |
| Starburst triarylamines | 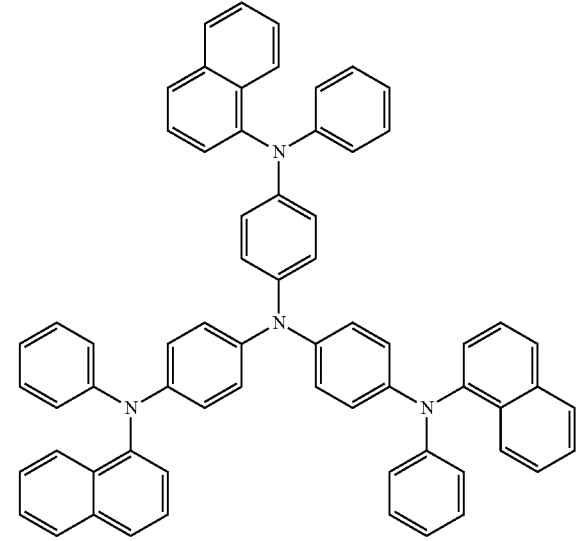 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT: PSS, polyaniline, polypthiophene) | 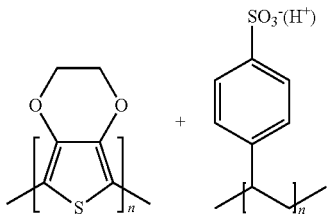 | Synth. Met. 87, 171 (1997) WO2007002683 |
| Phosphonic acid and sliane SAMs | 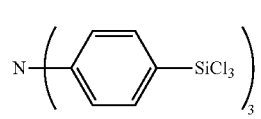 | US20030162053 |

TABLE 2-continued
| MATERIAL | EXAMPLES OF MATERIAL | PUBLICATIONS |
|---|---|---|
| Triarylamine or polythiophene polymers with conductivity dopants | 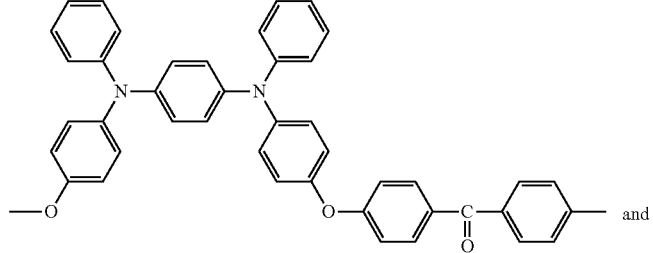 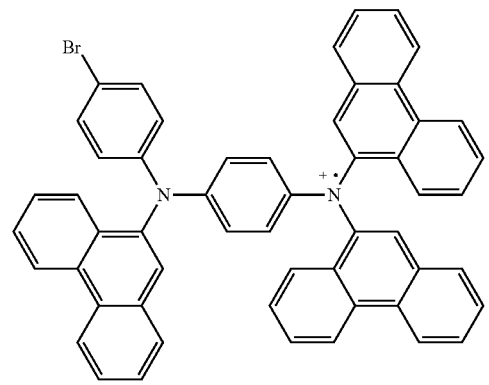 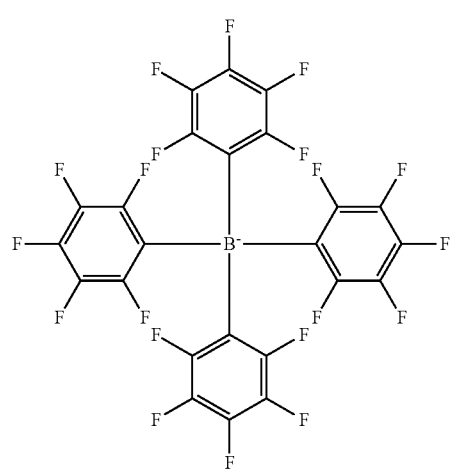 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EA01725079A1 |
| Arylamines complexed with metal oxides such as molybdenum and tungsten oxides | 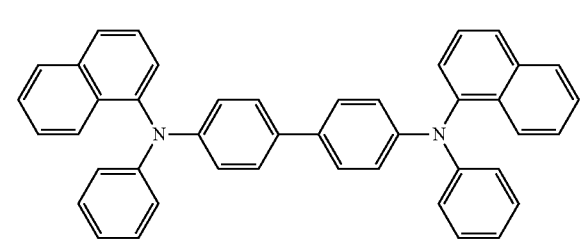 [SMILES: c1ccc(N(c2ccc(-c3ccc(N(c4ccccc4)c4cccc5ccccc45)cc3)cc2)c2cccc3ccccc23)cc1] | SID Symposium Digest, 37, 923 (2006) WO2009018009 |

TABLE 2-continued

| MATERIAL | EXAMPLES OF MATERIAL | PUBLICATIONS |
| --- | --- | --- |
| p-type semiconducting organic complexes | | US20020158242 |
| Metal organometallic complexes | | US20060240279 |
| Cross-linkable compounds | | US20080220265 |
| Hole transporting materials | | |
| Triarylamines (e.g., TPD, α-NPD) | | Appl. Phys. Lett. 51, 913 (1987) |
| | | U.S. Pat. No. 5,061,569 |

TABLE 2-continued

| MATERIAL | EXAMPLES OF MATERIAL | PUBLICATIONS |
|---|---|---|
| | | EP650955 |
| | | J. Mater. Chem. 3, 319 (1993) |
| | | Appl. Phys. Lett. 90, 183503 (2007) |

TABLE 2-continued

| MATERIAL | EXAMPLES OF MATERIAL | PUBLICATIONS |
| --- | --- | --- |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/ (di)benzofuran | | US20070278938, US20080106190 |

TABLE 2-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials

Red hosts

| | | |
| --- | --- | --- |
| Arylcarbazoles | | Appl. Phys. Lett. 78, 1622 (2001) |

TABLE 2-continued

| MATERIAL | EXAMPLES OF MATERIAL | PUBLICATIONS |
| --- | --- | --- |
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE 2-continued

| MATERIAL | EXAMPLES OF MATERIAL | PUBLICATIONS |
|---|---|---|
| Zinc complexes |  | WO2009062578 |
| Green hosts | | |
| Arylcarbazoles |  | Appl. Phys. Lett. 78, 1622 (2001) |
|  |  | US20030175553 |
|  |  | WO2001039234 |
| Aryltriphenylene compounds |  | US20060280965 |

TABLE 2-continued

| MATERIAL | EXAMPLES OF MATERIAL | PUBLICATIONS |
|---|---|---|
| | | US20060280965 |
| | | WO2009021126 |
| Donor acceptor type molecules | | WO2008056746 |
| Aza-carbazole/ DBT/DBF | | JP2008074939 |
| Polymers (e.g., PVK) | | Appl. Phys. Lett. 77, 2280 (2000) |

TABLE 2-continued

| MATERIAL | EXAMPLES OF MATERIAL | PUBLICATIONS |
| --- | --- | --- |
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

TABLE 2-continued

| MATERIAL | EXAMPLES OF MATERIAL | PUBLICATIONS |
| --- | --- | --- |
| | | JP2007254297 |
| Indolocabazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |

TABLE 2-continued
| MATERIAL | EXAMPLES OF MATERIAL | PUBLICATIONS |
|---|---|---|
| Tetraphenylene complexes | 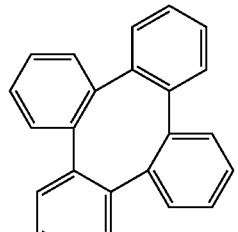 | US20050112407 |
| Metal phenoxypyridine compounds | 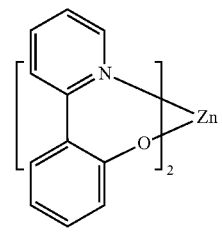 | WO2005030900 |
| Metal coordination complexes (e.g., Zn, Al with N^N ligands) | 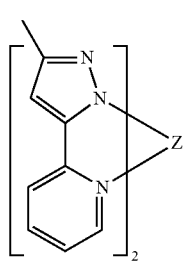 | US20040137268, US20040137267 |
Blue hosts
| | | |
|---|---|---|
| Arylcarbazoles | 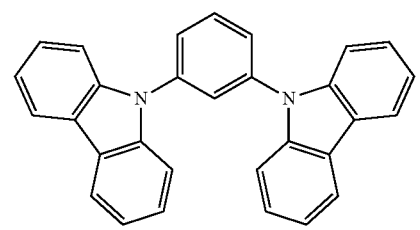 [SMILES: c1cc(-n2c3ccccc3c3ccccc32)cc(-n2c3ccccc3c3ccccc32)c1] | Appl. Phys. Lett, 82, 2422 (2003) |
| | 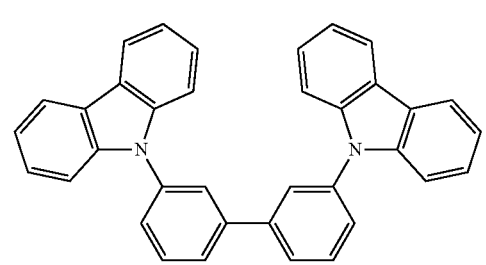 [SMILES: c1cc(-c2cccc(-n3c4ccccc4c4ccccc43)c2)cc(-n2c3ccccc3c3ccccc32)c1] | US20070190359 |

TABLE 2-continued
| MATERIAL | EXAMPLES OF MATERIAL | PUBLICATIONS |
|---|---|---|
| Dibenzothiophene/ Dibenzofuran- carbazole compounds | 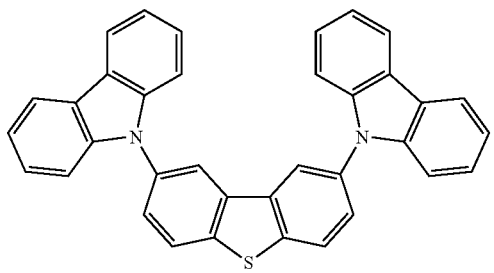 [SMILES: c1ccc2c(c1)c1ccccc1n2-c1ccc2sc3ccc(-n4c5ccccc5c5ccccc54)cc3c2c1] | WO2006114966, US20090167162 |
| | 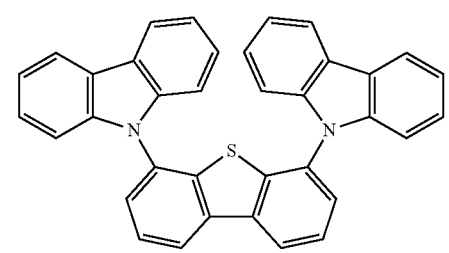 [SMILES: c1cc(-n2c3ccccc3c3ccccc32)c2sc3c(-n4c5ccccc5c5ccccc54)cccc3c2c1] | US20090167162 |
| | 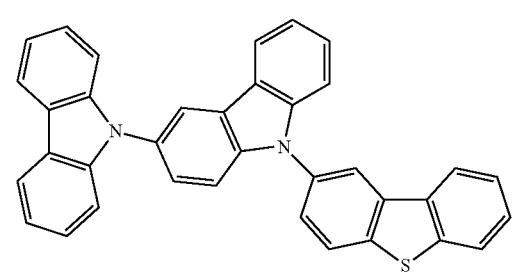 [SMILES: c1ccc2c(c1)sc1ccc(-n3c4ccccc4c4cc(-n5c6ccccc6c6ccccc65)ccc43)cc12] | WO2009086028 |
| | 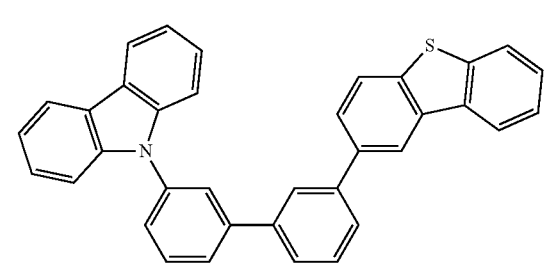 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 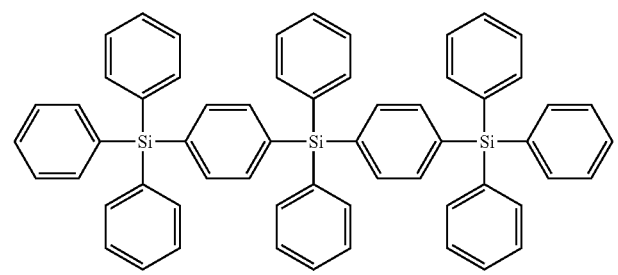 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 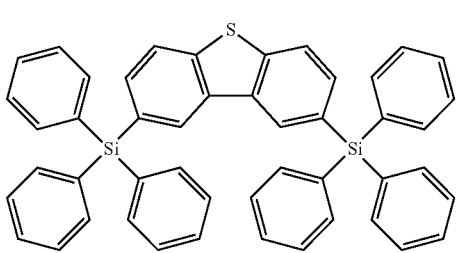 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 2-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| High triplet metal organometallic complex | | U.S. Pat. No. 7,154,114 |

Phosphorescent dopants

Red dopants

| | | |
| --- | --- | --- |
| Heavy metal porphyrins (e.g., PtOEP) | | Nature 395, 151 (1998) |
| Iridium(III) organometallic complexes | | Appl. Phys. Lett. 78, 1622 (2001) |

TABLE 2-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE 2-continued
| MATERIAL | EXAMPLES OF MATERIAL | PUBLICATIONS |
|---|---|---|
| | 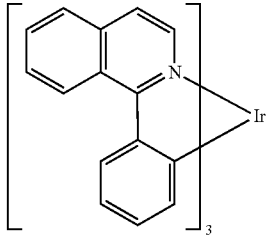 | US20070087321 |
| | 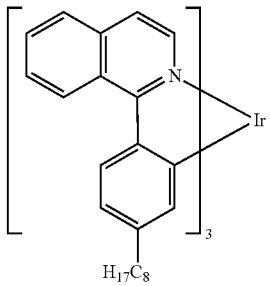 | Adv. Mater. 19, 739 (2007) |
| | 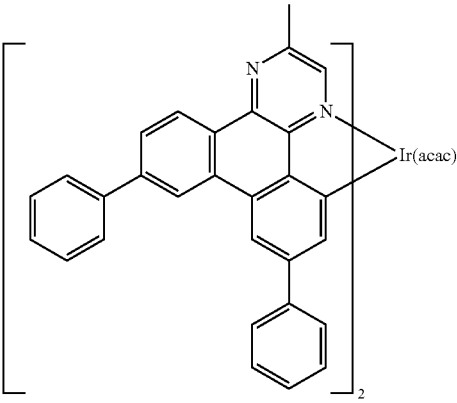 | WO2009100991 |
| | 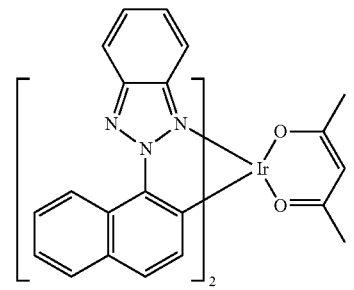 | WO2008101842 |
| Platinum(II) organometallic complexes | 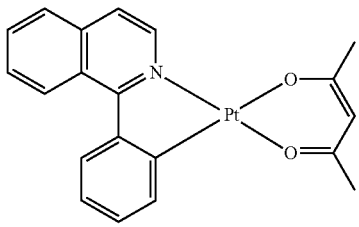 | WO2003040257 |

TABLE 2-continued

| MATERIAL | EXAMPLES OF MATERIAL | PUBLICATIONS |
| --- | --- | --- |
| Osminum(III) complexes | [structure with F$_3$C, pyrazole, pyridine, Os(PPhMe$_2$)$_2$]$_2$ | Chem. Mater. 17, 3532 (2005) |
| Ruthenium(II) complexes | [structure with $^t$Bu, pyrazole, isoquinoline, Ru(PPhMe$_2$)$_2$]$_2$ | Adv. Mater. 17, 1059 (2005) |
| Rhenium (I), (II), and (III) complexes | [structure with quinoline-O, Re—(CO)$_4$] | US20050244673 |

Green dopants

| | | |
| --- | --- | --- |
| Iridium(III) organometallic complexes | [Ir(ppy)$_3$ structure] and its derivatives | Inorg. Chem. 40, 1704 (2001) |
| | [Ir(ppy)$_2$(acac) structure] | US20020034656 |

TABLE 2-continued

| MATERIAL | EXAMPLES OF MATERIAL | PUBLICATIONS |
|---|---|---|
| | | U.S. Pat. No. 7,332,232 |
| | | US20090108737 |
| | | US20090039776 |
| | | U.S. Pat. No. 6,921,915 |

TABLE 2-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US 20060008670<br>JP2007123392 |
| | | Adv. Mater. 16, 2003 (2004) |

TABLE 2-continued
| MATERIAL | EXAMPLES OF MATERIAL | PUBLICATIONS |
|---|---|---|
| | 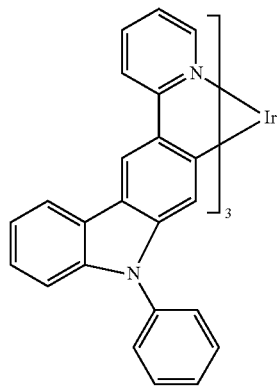 | Angew. Chem. Int. Ed. 2006, 45, 7800 |
| | 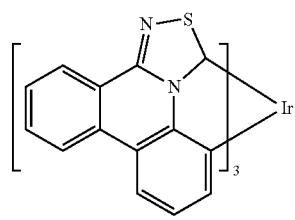 | WO2009050290 |
| | 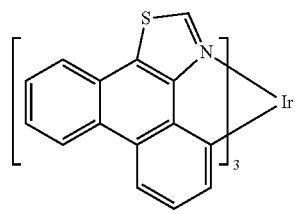 | US20090165846 |
| | 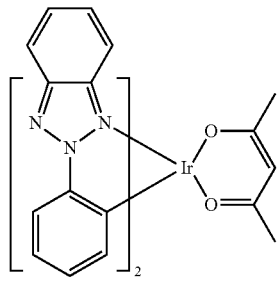 | US20080015355 |
| Monomer for polymeric metal organometallic compounds | 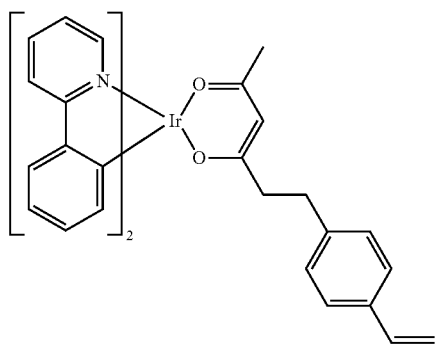 | U.S. Pat. No. 7,250,226, U.S. Pat. No. 7,396,598 |

TABLE 2-continued
| MATERIAL | EXAMPLES OF MATERIAL | PUBLICATIONS |
|---|---|---|
| Pt(II) organometallic complexes, including polydentated ligands | 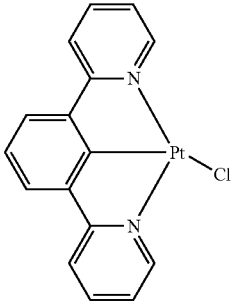 | Appl. Phys. Lett. 86, 153505 (2005) |
| | 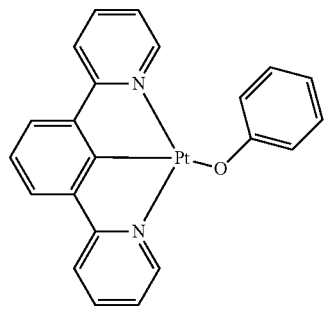 | Appl. Phys. Lett. 86, 153505 (2005) |
| | 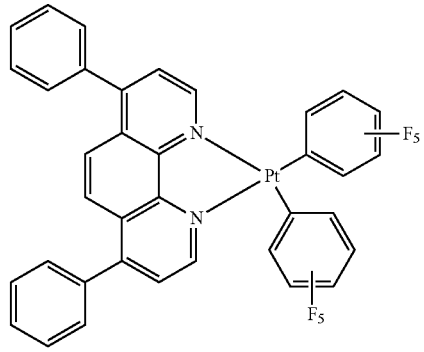 | Chem. Lett. 34, 592 (2005) |
| | 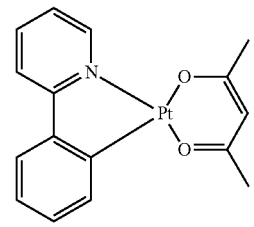 | WO2002015645 |
| | 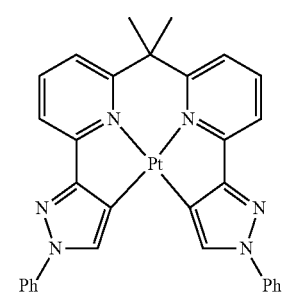 | US20060263635 |

TABLE 2-continued

| MATERIAL | EXAMPLES OF MATERIAL | PUBLICATIONS |
| --- | --- | --- |
| Cu complexes | | WO2009000673 |
| Gold complexes | | Chem. Commun. 2906 (2005) |
| Rhenium(III) complexes | | Inorg. Chem. 42, 1248 (2003) |
| Deuterated organometallic complexes | | US20030138657 |

TABLE 2-continued

| MATERIAL | EXAMPLES OF MATERIAL | PUBLICATIONS |
| --- | --- | --- |
| Organometallic complexes with two or more metal centers | | US20030152802 |
| | | U.S. Pat. No. 7,090,928 |
| Blue dopants | | |
| Iridium(III) organometallic complexes | | WO2002002714 |
| | | WO2006009024 |
| | | US20060251923 |

TABLE 2-continued
| MATERIAL | EXAMPLES OF MATERIAL | PUBLICATIONS |
|---|---|---|
| | 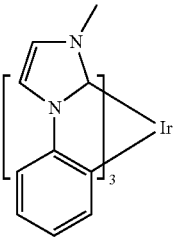 | U.S. Pat. No. 7,393,599, WO2006056418, US20050260441, WO2005019373 |
| | 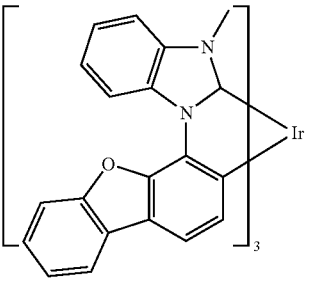 | U.S. Pat. No. 7,534,505 |
| | 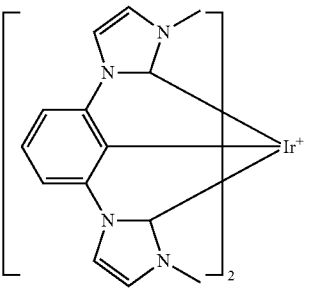 | U.S. Pat. No. 7,445,855 |
| | 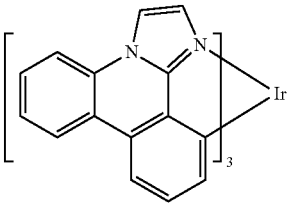 | US20070190359, US20080297033 |
| | 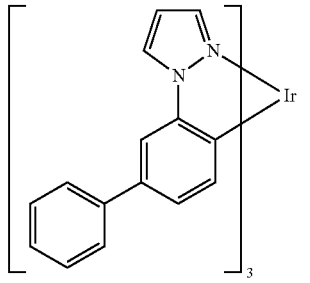 | U.S. Pat. No. 7,338,722 |
| | 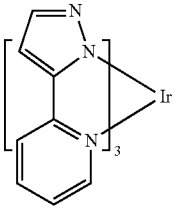 | US20020134984 |

TABLE 2-continued

| MATERIAL | EXAMPLES OF MATERIAL | PUBLICATIONS |
|---|---|---|
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE 2-continued
| MATERIAL | EXAMPLES OF MATERIAL | PUBLICATIONS |
|---|---|---|
| | 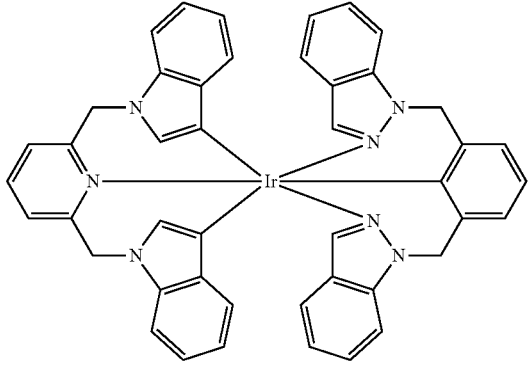 | WO2006082742 |
| Osmium(II) complexes | 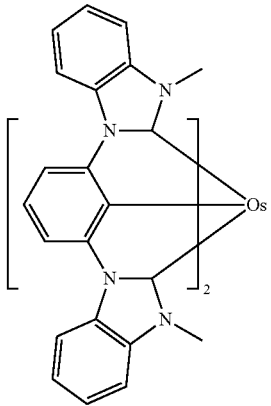 | U.S. Pat. No. 7,279,704 |
| | 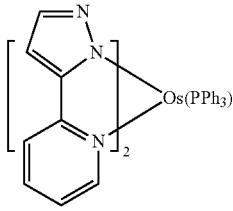 | Organometallics 23, 3745 (2004) |
| Gold complexes | 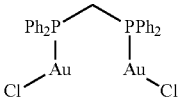 | Appl. Phys. Lett. 74, 1361 (1999) |
| Platinum(II) complexes | 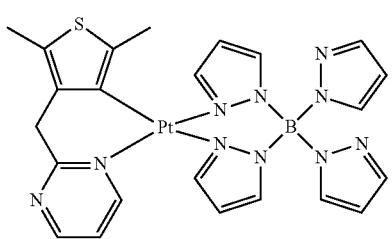 | WO2006098120, WO2006103874 |

TABLE 2-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 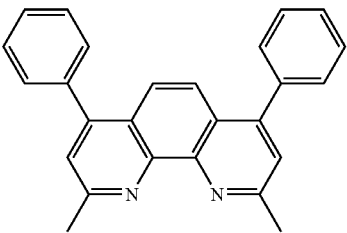 [SMILES: Cc1cc(-c2ccccc2)c2ccc3c(-c4ccccc4)cc(C)nc3c2n1] | Appl. Phys. Lett. 75, 4 (1999) |
| | 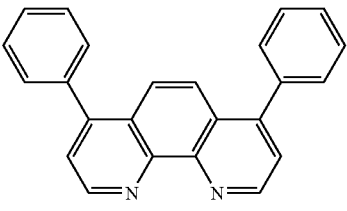 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 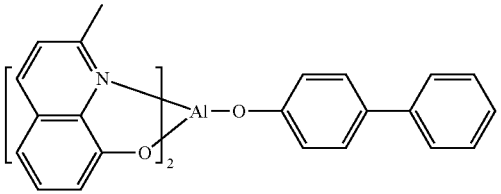 | Appl. Phys. Lett. 81, 162 (2002) |
| 5-member ring electron deficient heterocycles such as triazole, oxadiazole, imidazole, benzoimidazole | 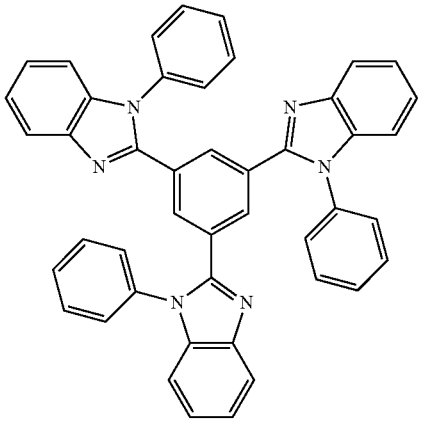 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 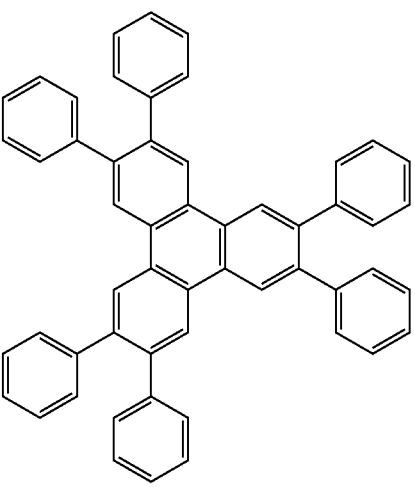 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE 2-continued
| MATERIAL | EXAMPLES OF MATERIAL | PUBLICATIONS |
|---|---|---|
| Fluorinated aromatic compounds | 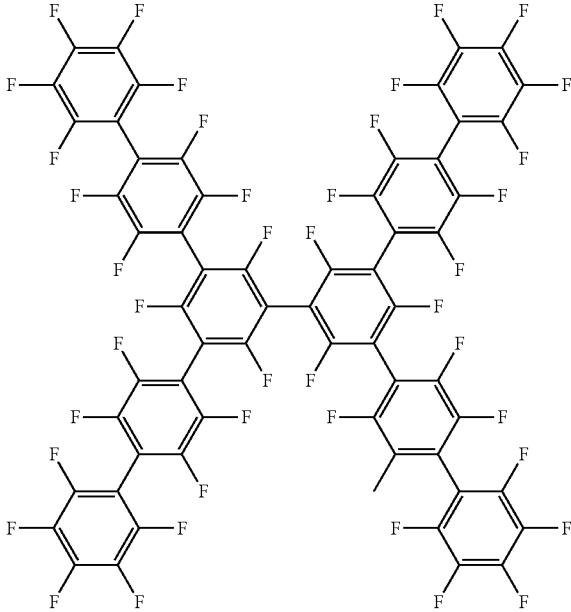 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 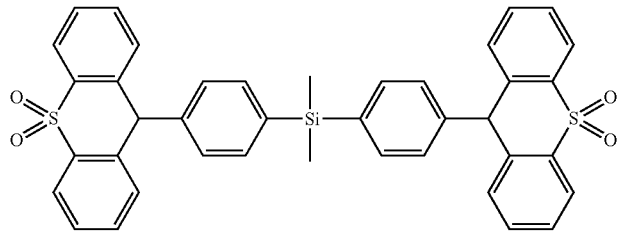 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
Electron transporting materials
| Anthracene-benzoimidazole compounds | 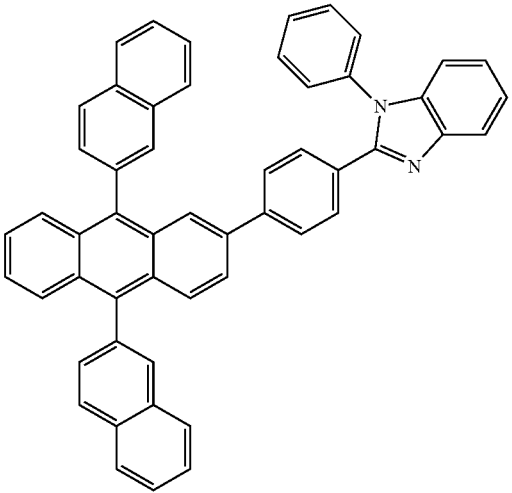 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
|---|---|---|

TABLE 2-continued
| MATERIAL | EXAMPLES OF MATERIAL | PUBLICATIONS |
|---|---|---|
| | 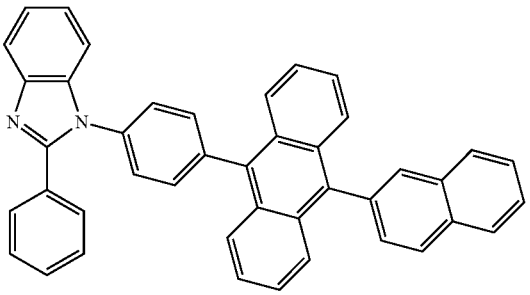 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 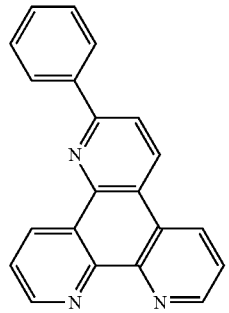 [SMILES: c1ccc(-c2ccc3c4cccnc4c4ncccc4c3n2)cc1] | US20090115316 |
| Anthracene-benzothiazole compounds | 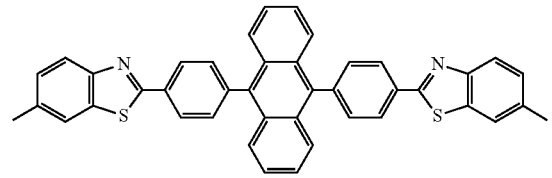 | Appl. Phys. Lett. 89, 063504 (2006) |
| Metal 8-hydroxyquinolates (e.g., Alq$_3$, Zrq$_4$) | 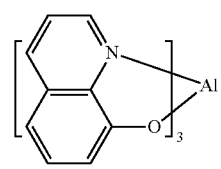 | Appl. Phys. Lett. 51, 913 (1987)<br>U.S. Pat. No. 7,230,107 |
| Metal hydroxybenoquinolates | 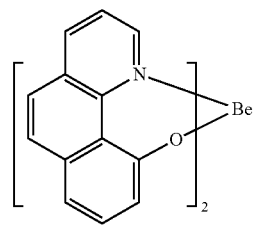 | Chem. Lett. 5, 905 (1993) |
| Bathocuprine compounds such as BCP, BPhen, etc | 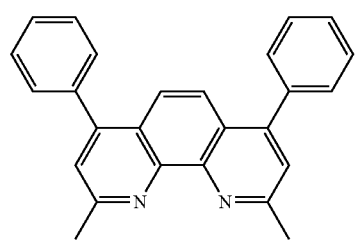 [SMILES: Cc1cc(-c2ccccc2)c2ccc3c(-c4ccccc4)cc(C)nc3c2n1] | Appl. Phys. Lett. 91, 263503 (2007) |

TABLE 2-continued

| MATERIAL | EXAMPLES OF MATERIAL | PUBLICATIONS |
| --- | --- | --- |
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |

| MATERIAL | EXAMPLES OF MATERIAL | PUBLICATIONS |
| --- | --- | --- |
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device, comprising:
a pixel comprising:
a first subpixel comprising:
a first organic light emitting device comprising a first material that is an emitting material having a first emissive spectrum; and a first triplet-triplet annihilation up conversion layer disposed adjacent to the first organic light emitting device such that light emitted by the organic light emitting device is incident on the first triplet-triplet annihilation up conversion layer, the first triplet-triplet annihilation up conversion layer comprising a first donor material and a first acceptor material, wherein the first donor material has an absorption spectrum that overlaps with the first emissive spectrum;

a second subpixel comprising a second organic light emitting device comprising a second material that is an emitting material having a second emissive spectrum with a peak wavelength of about 500 nm to about 600 nm; and a third subpixel comprising a third organic light emitting device comprising a third material that is an emitting material having a third emissive spectrum with a peak wavelength of about 600 nm to about 700 nm.

2. The device of claim 1, wherein the third subpixel further comprises:
a first down conversion layer disposed adjacent to the third organic light emitting device such that light emitted by the third organic light emitting device is incident on the first down conversion layer.

3. The device of claim 1, wherein the second subpixel does not include an up-conversion layer or a down conversion layer.

4. The device of claim 1, wherein the first material has an emissive spectrum having a peak wavelength of about 500 nm to about 600 nm.

5. The device of claim 1, wherein the second subpixel does not comprise an up-conversion layer or a down conversion layer.

6. The device of claim 1 or 5, wherein the first triplet-triplet annihilation up-conversion layer absorbs between about 80 percent and about 100 percent of the light emitted from the organic light emitting device.

7. The device of claim 1 or 5, wherein the device further comprises at least one filter that absorbs light having a peak wavelength of about 500 nm to about 600 nm.

8. The device of claim for 5, wherein the device further comprises at least one microcavity that absorbs light having a peak wavelength of about 500 nm to about 600 nm.

9. The device of claim 1 or 5, wherein the device absorbs 99 percent of the emitted light emitted by the first material.

10. The device of claim 1, wherein the first subpixel has an emissive spectrum that has a peak wavelength of about 400 nm to about 500 nm.

11. The device of claim 1, wherein the first material has an emissive spectrum having a peak wavelength of about 500 nm to about 600 nm;
wherein, in the first subpixel:
the first material emits light having a peak wavelength of about 500 to about 600 nm; and
the first triplet-triplet annihilation up-conversion layer absorbs light having a peak wavelength of about 500 nm to about 600 nm and emits light having a peak wavelength of about 400 nm to about 500 nm;
such that the first subpixel emits light having a peak wavelength of about 400 nm to about 500 nm;
wherein the second subpixel does not include an up-conversion or a down conversion layer, and the second subpixel emits light having a wavelength of about 500 nm to about 600 nm; and
wherein the third subpixel includes a down conversion layer, and the down conversion layer absorbs light having a peak wavelength of about 500 nm to about 600 nm and emits light having a peak wavelength of about 600 nm to about 700 nm;
such that the third subpixel emits light having a peak wavelength of about 600 nm to about 700 nm.

12. The device of claim 11, wherein the first material, the second material, and the third material are the same material.

13. The device of claim 1, wherein the first organic light emitting device is capable of emitting a first spectrum of light having a first peak wavelength when voltage is applied to the device, and the up-conversion layer is capable of absorbing the first spectrum of light and emitting a second spectrum of light with a second peak wavelength, wherein the second peak wavelength is shorter than the first peak wavelength.

14. The device of claim 1, wherein the first triplet-triplet annihilation up-conversion layer absorbs between about 20 percent and about 80 percent of the light emitted by the first material.

15. The device of claim 1, wherein the device has CIE coordinates of x=0.10-0.40, y=0.05-0.40.

16. The device of claim 1, wherein the device has a CRI of about 80 to about 100.

17. The device of claim 1, wherein the first triplet-triplet annihilation up-conversion layer is a solution.

18. The device of claim 1, wherein the first triplet-triplet annihilation up conversion layer is a solid film.

19. The device of claim 1, wherein the first organic light emitting device is a green organic light emitting device or red organic light emitting device.

20. The device of claim 1, wherein the first material emits light having CIE coordinates of within a seven step McAdam ellipse centered on the black body curve with a correlated color temperature (CCT) in the range of 2500-7400K , and wherein the first device emits light having CIE coordinates of within a seven step McAdam ellipse centered on the black body curve with a correlated color temperature (CCT) at least 50K higher than that of the emission of the first material.

21. The device of claim 1, wherein the first material emits light having a peak wavelength of about 500 nm to about 700 nm, and the first device emits light having CIE coordinates of within a seven step McAdam ellipse centered on the black body curve with a correlated color temperature (CCT) in the range of 2500-7000K.

22. The device of claim 1, further comprising a filter deposited over the organic light emitting device.

23. The device of claim 1, wherein the device is an area emitting device.

24. The device of claim 1, wherein the first triplet-triplet annihilation up-conversion layer and the organic light emitting device are deposited on the same substrate.

25. The device of claim 1, wherein the first triplet-triplet annihilation up-conversion layer is vertically-stacked upon the organic light emitting device.

26. The device of claim 1, wherein the first triplet-triplet annihilation up-conversion layer and the organic light emitting device are positioned side by side.

27. The device of claim 1, wherein the first device is a display.

28. The device of claim 1, wherein the first device is suitable for general illumination purposes.

29. The device of claim 1, wherein the first triplet-triplet annihilation up-conversion layer has a linear or circular light polarization function.

30. The device of claim 1, wherein the first material is a small molecule.

31. The device of claim 1, wherein the first material is a phosphorescent molecule.

32. The device of claim 1, wherein the first donor materials are selected from the group consisting of:

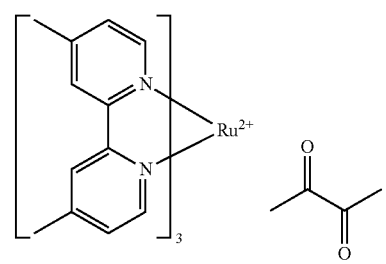

101
-continued
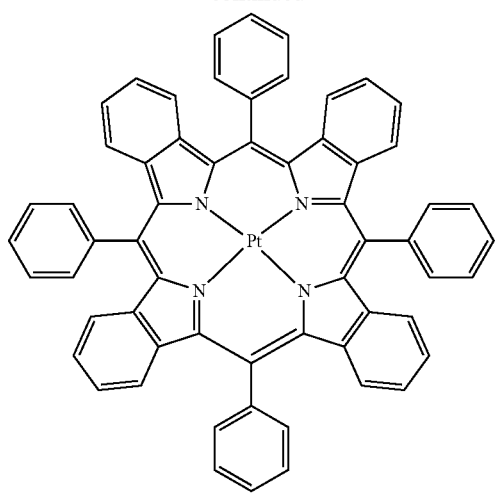
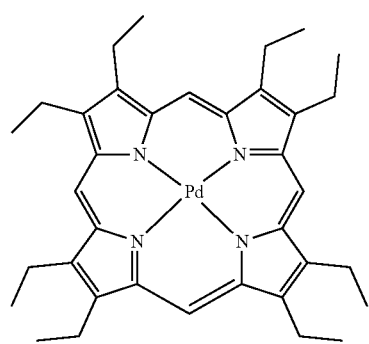
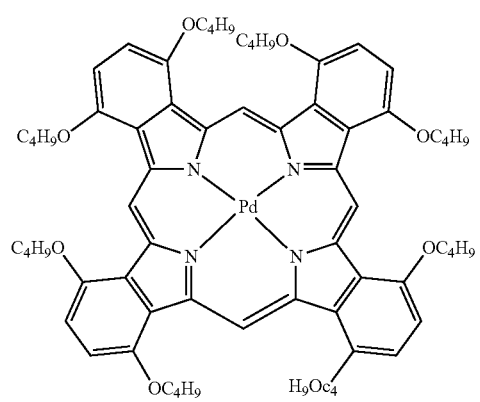
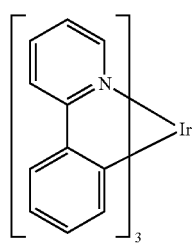
102
-continued
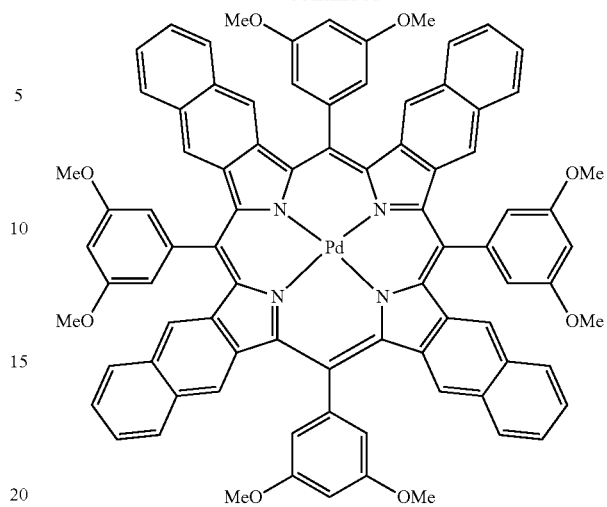
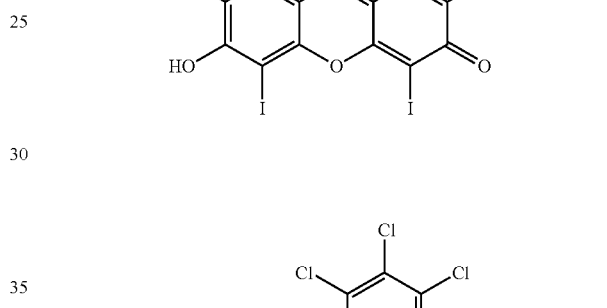
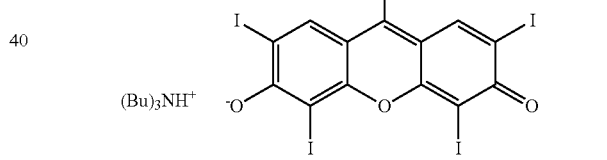
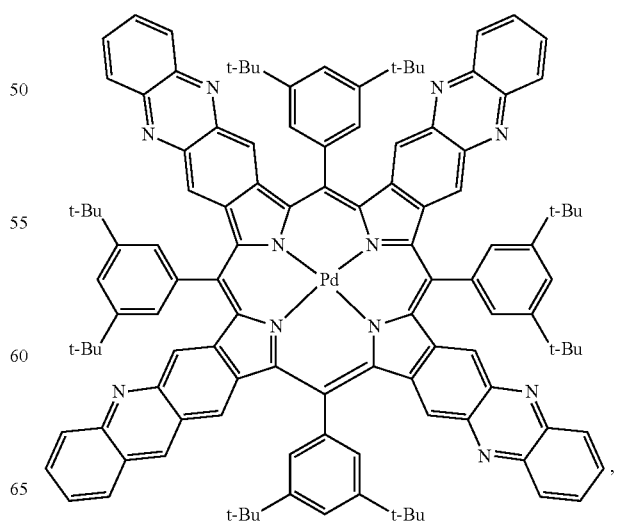

wherein the first donor materials may be substituted or unsubstituted; and
wherein the first acceptor materials are selected from the group consisting of:
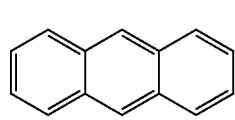 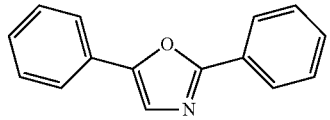
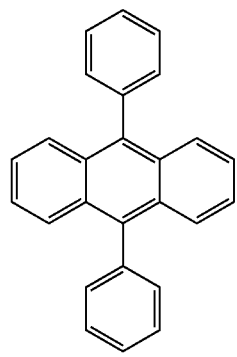 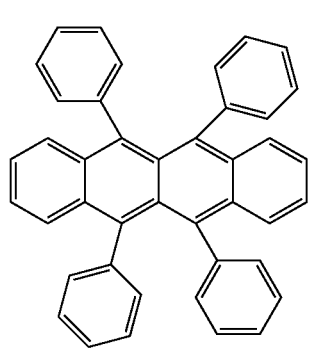
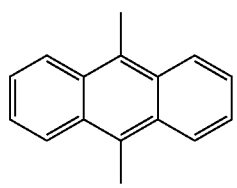 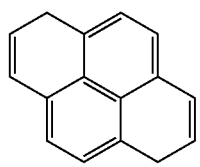
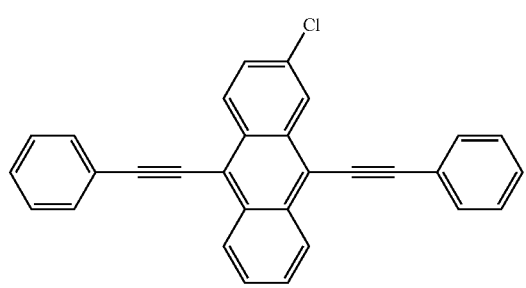
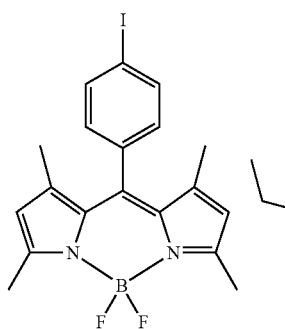 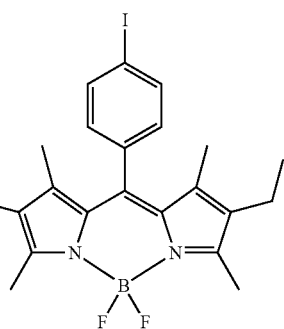
-continued
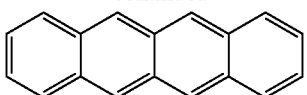
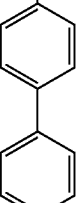
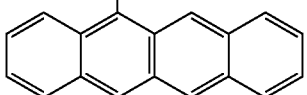
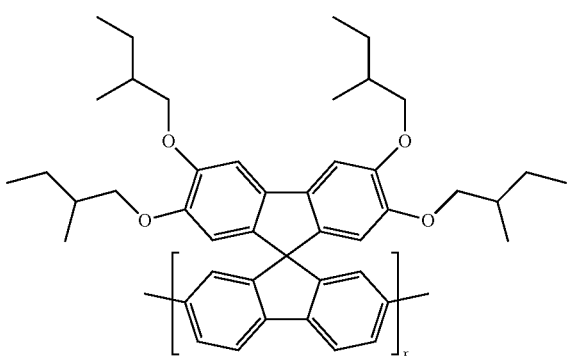
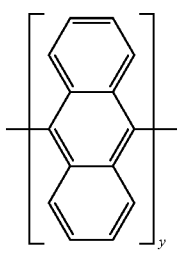
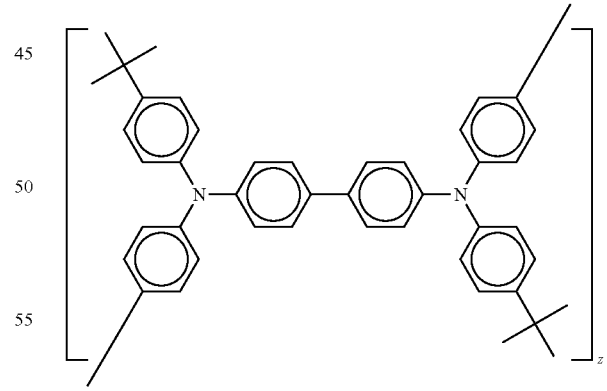
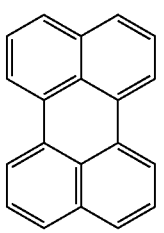, wherein the first acceptor material may be substituted or unsubstituted.

* * * * *